US012575049B2

(12) United States Patent
Lin et al.

(10) Patent No.: US 12,575,049 B2
(45) Date of Patent: Mar. 10, 2026

(54) CHASSIS HAVING A BASE PAN FOR USE WITH DIFFERENT MOUNTING TRAYS

(71) Applicant: HEWLETT PACKARD ENTERPRISE DEVELOPMENT LP, Spring, TX (US)

(72) Inventors: Yu Han Lin, Taoyuan City (TW); Jui Lin Chen, Taipei City (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 335 days.

(21) Appl. No.: 18/307,908

(22) Filed: Apr. 27, 2023

(65) Prior Publication Data

US 2024/0365498 A1     Oct. 31, 2024

(51) Int. Cl.
H05K 7/00        (2006.01)
H05K 7/14        (2006.01)

(52) U.S. Cl.
CPC ................................. H05K 7/1487 (2013.01)

(58) Field of Classification Search
CPC ....................................................... G06F 1/16
See application file for complete search history.

(56) References Cited

U.S. PATENT DOCUMENTS 3,926,236 A * 12/1975 Pouch ................... B23P 19/062
                                                            411/968
6,170,858 B1 * 1/2001 Berger .................. B60R 21/217
                                                            411/301

6,424,537 B1 * 7/2002 Paquin ................... H05K 7/142
                                                            361/752
6,799,980 B2 * 10/2004 Bloomfield .............. H01R 4/66
                                                            439/95
7,028,389 B2 * 4/2006 Chang .................... H05K 7/142
                                                            174/544
7,035,096 B2 * 4/2006 Franz ...................... G06F 1/184
7,040,905 B1 * 5/2006 Wang ................... H05K 7/1418
                                                            361/759
7,385,830 B2 * 6/2008 Liu ......................... H05K 7/142
                                                            174/138 R
7,539,021 B2 * 5/2009 Peng ........................ H05K 9/00
                                                            361/752
7,656,657 B2    2/2010 Grady et al.
(Continued)

FOREIGN PATENT DOCUMENTS

CN            201126554 Y    10/2008

*Primary Examiner* — Anthony Q Edwards
*Assistant Examiner* — Rashen E Morrison
(74) *Attorney, Agent, or Firm* — Jones Robb PLLC

(57)              ABSTRACT

An assembly may comprise a mounting tray configured to have at least one printed circuit board mounted to its top surface and further comprises a set of spools extending from an outer surface of the first mounting tray, each spool including a barrel and a flange. The assembly may comprise a base pan including a set of keyholes, each keyhole including an entry hole and a slot extending from the entry hole. The base pan is configured to attach to the mounting tray by engaging the set of spools with a group of keyholes, respectively, by inserting the flange of each spool through the entry hole of a corresponding keyhole and moving the mounting tray relative to the base pan such that the barrel of each spool is received within the slot, and the flange of each spool of the set of spools is secured by a rim of the slot of the corresponding keyhole.

21 Claims, 19 Drawing Sheets

(56) References Cited

U.S. PATENT DOCUMENTS

| | | | | |
|---|---|---|---|---|
| 8,434,217 B2 * | 5/2013 | Chiu | .................. | F16B 21/09 |
| | | | | 29/757 |
| 8,456,853 B2 * | 6/2013 | Lin | .................. | F16B 37/043 |
| | | | | 361/759 |
| 8,649,180 B2 * | 2/2014 | Grady | .................. | G06F 1/183 |
| | | | | 361/725 |
| 8,787,027 B2 * | 7/2014 | Lu | .................. | H05K 7/142 |
| | | | | 361/752 |
| 8,837,169 B2 * | 9/2014 | Lu | .................. | H05K 5/0221 |
| | | | | 361/799 |
| 8,929,088 B2 * | 1/2015 | Ma | .................. | H05K 7/142 |
| | | | | 361/759 |
| 9,121,422 B2 * | 9/2015 | Sauer | .................. | F16B 33/002 |
| 10,462,910 B2 * | 10/2019 | Brodbeck | .................. | F16B 21/082 |
| 10,895,275 B2 * | 1/2021 | Yang | .................. | F16B 5/02 |
| 11,121,490 B1 * | 9/2021 | Fu | .................. | H01R 12/71 |
| 12,120,831 B2 * | 10/2024 | Tsorng | .................. | H05K 5/023 |
| 2003/0124887 A1 * | 7/2003 | Bloomfield | .................. | H01R 4/66 |
| | | | | 439/92 |
| 2007/0279858 A1 * | 12/2007 | Grady | .................. | G06F 1/183 |
| | | | | 361/641 |
| 2008/0264192 A1 * | 10/2008 | Christensen | .................. | H05K 7/1409 |
| | | | | 74/469 |
| 2012/0145723 A1 * | 6/2012 | Chiu | .................. | H05K 7/142 |
| | | | | 220/660 |
| 2021/0360812 A1 * | 11/2021 | Chen | .................. | G06F 1/185 |
| 2023/0012759 A1 * | 1/2023 | Chiappe | .................. | H05K 3/368 |

* cited by examiner

1600

1610 Position set of spools on mounting tray proximate to corresponding set of keyholes on base pan 1620 Engage set of spools with corresponding set of keyholes 1630 Adjust position of mounting tray to attach to base pan

CHASSIS HAVING A BASE PAN FOR USE WITH DIFFERENT MOUNTING TRAYS

INTRODUCTION

In many electronic systems, such as servers and networking devices, the electronic components of the system (e.g., processors, memory, storage drives, etc.) are enclosed in and/or supported by a mechanical structure, referred to as a chassis. A chassis typically includes a base pan that forms the bottom of the chassis. The chassis also typically includes lateral walls, a front section, a rear section, and a lid or top cover. The electronic components of the system may include an electronic assembly comprising one or more printed circuit boards or printed circuit assemblies that are attached to a mounting tray, often referred to as a motherboard tray. The mounting tray is mechanically attached to the base pan such that the mounting tray is parallel to the bottom surface of the base pan. When the electronic assembly is mounted to the mounting tray and the mounting tray is attached to the base pan, electrical connectors associated with the electronic components are positioned at predetermined positions in or adjacent to a rear wall module included as part of the rear section of the chassis (e.g., each connector positioned at or in a corresponding opening in the rear wall module).

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings.

DETAILED DESCRIPTION

Figure 1A:
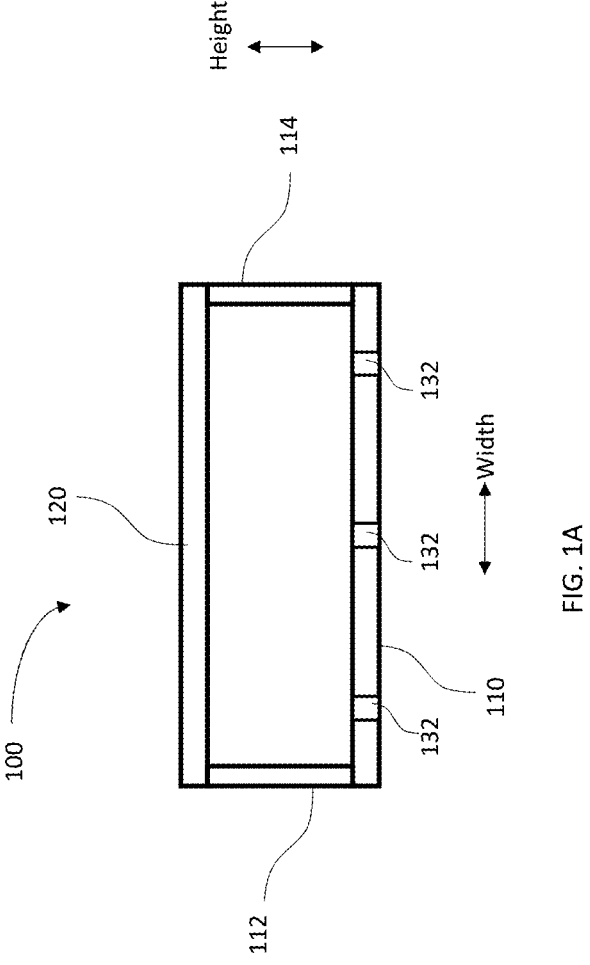
FIG. 1A is a block diagram illustrating a chassis for an electronic device.

Electronic systems include electronic components that are enclosed in and/or supported by a chassis. The electronic components of the system include one or more printed circuit assemblies attached to a mounting tray which is mechanically attached to the base pan of the chassis. Different printed circuit assemblies may require different attachment points and/or attachment mechanisms between the mounting tray used with the printed circuit assembly and the base pan. These different attachment points and/or attachment mechanisms may be used to accommodate varying dimensions for the printed circuit assemblies as well as specific electronic component placement requirements on the printed circuit assemblies. Typically, at least part of the attachment mechanism protrudes from the bottom inner surface of the base pan into the interior of the chassis and interfaces to a portion of the mounting tray and/or the printed circuit assemblies. For example, in one electronic assembly, one or more clip mechanisms may be extended from the bottom inner surface of the base pan. The mechanisms clip onto openings in the mounting tray to attach the mounting tray to the base pan.

Generally, different systems may utilize different chassis and mounting trays from one another, and the chassis of one system may not be usable with the mounting tray of another system (or vice versa). In other words, a system may have a combination of a chassis and a mounting tray that is unique to that system. This inability to intermix the chassis and mounting trays between different systems is generally due to the mounting tray of each different system having different attachment locations configured to receive the mounting mechanisms of the base pan to attach the mounting tray to the chassis. Thus, when a mounting tray designed for one system is placed in a chassis designed for another system, one or more of the mounting mechanisms of the base pan (e.g., clips) may not align with a corresponding attachment location of the mounting tray, and thus the unused mounting mechanism may collide with or otherwise interfere with the mounting tray and/or printed circuit board. One reason the mounting trays of different systems may have different attachment locations for the mounting mechanisms is that different systems may have different layouts of electrical components (e.g., on a printed circuit board, which is coupled to the mounting tray) and the layout of the electronic components may dictate where attachment locations can be located (e.g., to avoid having a mounting mechanism interfere with the electrical components).

However, it may be desirable in some circumstances to be able to use the same base pan design for multiple different systems, as this may reduce manufacturing costs. To allow the same base pan design to be used in multiple different systems, the base pan may need to be configured to accommodate a plurality of different printed circuit assemblies using different types of mounting trays with different attachment arrangements. However, as noted above, in existing systems base pans generally cannot accommodate multiple different types of mounting trays because the presence of the attachment mechanisms already included on the base pan, such as the clip mechanisms, can cause an interference when trying to attach the different mounting trays that have different arrangements for their attachment locations. On approach to resolving this difficulty is to configure the printed circuity assemblies and their mounting trays to accommodate the locations of the mounting mechanisms of the base pan. The presence of the attachment mechanisms of the base pan can be taken into account as part of the design of both of the printed circuit assemblies by considering the locations of the attachment mechanisms of the base pan as exclusion areas (i.e., areas where electronic components cannot be located) as part of the design of the printed circuit assemblies. But generally the locations where exclusion areas may be convenient or optimal on one printed circuity assembly may not be convenient or optimal on another printed circuit assembly, and thus one or both of the printed circuit assemblies may end up with a sub-optimal layout as a result of requiring the two assemblies to have the same exclusion areas. Moreover, even if optimal layouts can be obtained, it may be more difficult and costly to design the two printed circuit assemblies with the same exclusion regions. Thus, these increased constraints on the design of the printed circuit assemblies can increase development time and cost of the electronic system. Thus, it is often difficult to reuse the same base pan design in the chassis for multiple systems having different printed circuit assemblies.

To address the issues noted above related to allowing a single base pan design to be utilized in multiple systems having different printed circuit assemblies, examples disclosed herein provide a base pan that can be used with multiple different mounting trays having different mounting mechanism locations without requiring that the different printed circuit assemblies coupled to the mounting trays have the same exclusion areas as one another. In particular, the mounting mechanisms that attach the mounting tray to the base pan comprise spools coupled to the mounting trays and keyholes in the base pan to receive the spools. A mounting tray may include a set of spools extending from the surface of the mounting tray opposite the printed circuit assembly and adjacent to the base pan of the chassis, and different mounting trays may have different numbers and/or locations for these spools. The base pan may include a set of keyholes that are configured to accept the spools from multiple different mounting trays. Because different mounting trays having different arrangements of the spools can be mounted to the same base pan, the base pan may be usable in multiple different systems. The mechanism described herein differs from previous approaches that use different attachment mechanisms, as described above, in that the base pan has no protrusions as part of the attachment mechanism, allowing the surface of the base pan closest to the mounting tray to remain relatively flat. As a result, when one of the keyholes of the base pan is unused because the mounting tray does not have an attachment location corresponding to the keyhole, the unused keyhole does not collide with or otherwise interfere with the mounting tray or printed circuity assembly. Thus other mounting trays having different arrangements of spools can be attached to the same base pan using different groups or subsets of keyholes without the interference issues described above. Because the mounting trays can have different arrangements of spools, the printed circuit boards of the various systems can be designed in whatever way is convenient or optimal for that board without the designer being constrained to use the exact same exclusion areas as were used in another board, thus saving on development time and costs.

In some examples, each of the spools comprises a barrel and a flange, and each of the keyholes comprises an entry opening and a slot. As a mounting tray is being attached to the base pan, the flange on each one of the spools from the mounting tray is inserted through the entry opening in a corresponding keyhole of a group or subset of the keyholes on the base pan. Then, the position of the mounting tray is adjusted to slide the barrels of the spools into the slots of the keyholes such that the flanges fit against the rims of the slots, thereby attaching the mounting tray to the base pan.

In some examples, the rim of the slot in each one of the set of keyholes may be chamfered inward from an outer surface of the base pan to an inner surface of the base pan. The flange of each one of the spools may be tapered inward from an outer surface of the flange towards the barrel such that the tapered flange is complementary to the chamfered rim of the slot.

In some examples, the outer surface of the flange of each one of the set of spools is flush with the outer surface of the base pan when the mounting tray is attached to the inner surface of the base pan.

In some examples, the printed circuit assembly is configured to operate as an electronic device, such as a motherboard, a memory board, a power supply board, or a network communication board.

Turning now to the figures, various devices, systems, and methods in accordance with aspects of the present disclosure will be described.

Figure 1B:
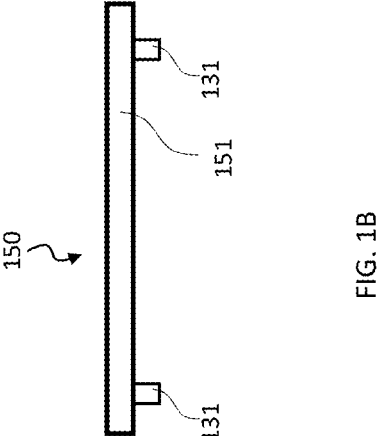
FIG. 1B is a block diagram illustrating a mounting tray that can be mounted to the chassis of FIG. 1A.
Figure 1C:
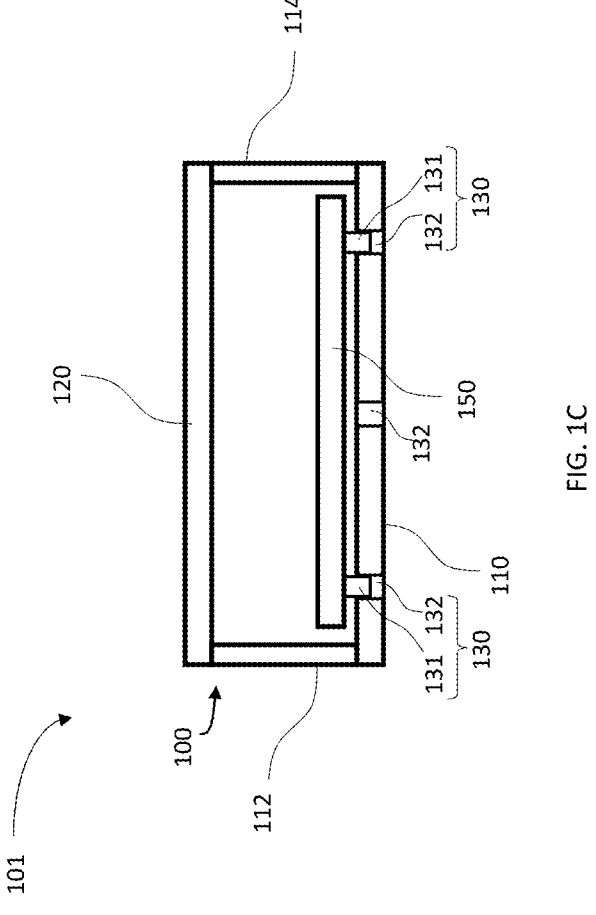
FIG. 1C is a block diagram illustrating a mechanical assembly comprising the mounting tray of FIG. 1B attached to the chassis of FIG. 1A.
Figure 1D:
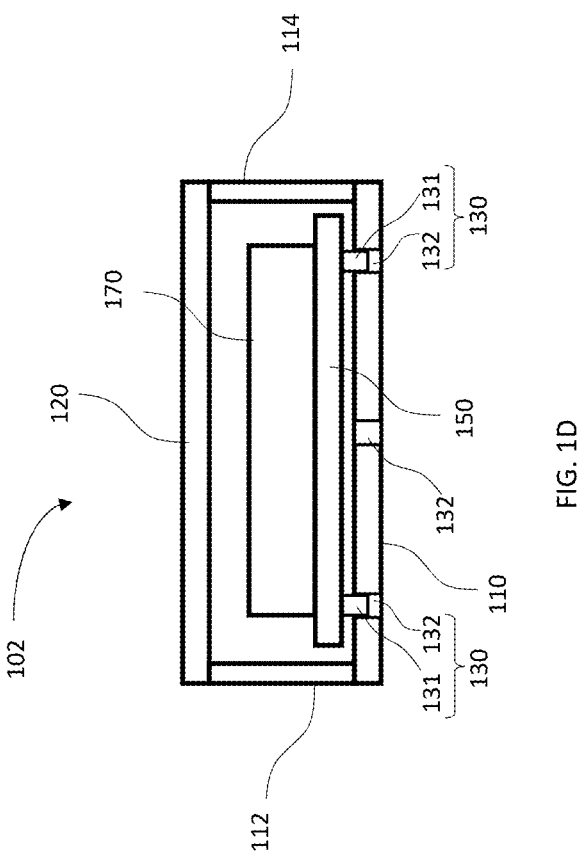
FIG. 1D is a block diagram illustrating an electronic device comprising a printed circuit board assembly and the mechanical assembly of FIG. 1C.

FIGS. 1A-1D are block diagrams conceptually illustrating a chassis 100 for an electronic device (FIG. 1A), a mounting tray 150 (FIG. 1B), a mechanical assembly 101 comprising the chassis 100 chassis 100 and the mounting tray 150 (FIG. 1C), and an electronic device 102 comprising the mechanical assembly 101 and a printed circuit assembly 170 (FIG. 1D). It should be understood that FIGS. 1A-1D are not intended to illustrate specific shapes, dimensions, or other structural details accurately or to scale, and that implementations of the chassis 100 illustrated devices may have different numbers and arrangements of the illustrated components and may also include other parts that are not illustrated.

As shown in FIG. 1A, the chassis 100 comprises a base pan 110 serving as a bottom of the chassis 100. The base pan 110 is configured to receive a mounting tray 150 attached thereon, as will be described in greater detail below with reference to FIG. 1C. Thus the base pan 110 comprises a plurality of mounting element 132 which form one part of a set of mechanical fasteners 130 for attaching the mounting tray 150 to the base pan 110, with the other part of the set of mechanical fasteners 130 being mounting elements 131 of the mounting tray 150, as described in greater detail below with reference to FIGS. 1B and 1C. The mounting elements 132 do not protrude from base pan 110 into the interior of the chassis 100, and instead comprise one or more recessed mounting elements such as apertures, slots, grooves, tracks, or other recessed mounting elements.

The mounting elements 132 are positioned on the base pan 110 in a predetermined pattern such that at least a first subset of the mounting elements 132 can be aligned with the mounting elements 131 of a first mounting tray 150. Moreover, the locations of the mounting elements 132 are such that at least a second subset of the mounting elements 132 can be aligned with the mounting elements 131 of a second mounting tray 150, wherein the first and second mounting trays 150 have different positional arrangements of their mounting elements 131. Thus, the base pan 110 can receive a plurality of different mounting trays 150 (one at a time) having different arrangements of mounting elements 130. This can enable the base pan 110 and/or chassis 100 to be used in a plurality of different electronic devices.

The chassis 100 can be in the general shape of a hollow cube or a hollow rectangular cuboid (with one or more sides thereof being omitted or being discontinuous and/or having openings formed therein) having a height, width and depth that can accommodate the mounting tray 150 and printed circuit assembly 170 along with other electronic devices, such as disk drives, cooling fans, and heatsinks. Width and height dimensions are indicated in FIG. 1A, with the depth dimension being perpendicular to the width and height dimensions (i.e., extending into the page in FIG. 1A). The chassis 100 can be formed out of a suitable structural material. Suitable structural materials include, but are not limited to, metals such as steel, copper, brass, aluminum, or other relatively rigid materials such as plastics. In one example, the server chassis is formed out of steel having a thickness of 1.2 millimeter (mm) and has a height of 8.89 centimeters (cm), a width of 43.18 cm, and a depth of 60.96 cm. In addition to the base pan 110, the chassis 100 may also comprise two lateral walls 112 and 114 that are mechanically coupled or fastened to the base pan 120. The lateral walls 112 and 114 may extend for all or part of the depth of the chassis 100. The chassis 100 may also have a top 120 that is mechanically coupled or fastened to the two lateral walls 112 and 114 and similarly may extend for all or part of the depth.

In some examples, the chassis 100 may also comprise a front section (not illustrated) and a rear section (not illustrated). In some examples, the front section and/or the rear section of the chassis 100 may be fully or partially covered by one or more panels that may have perforated sections for ventilation. The front section may include receptacles or openings for electronic components, such as memory devices or disk drives. The rear section may also include openings through which electronic interface connectors associated with the printed circuit assembly 170 or other electronic components in the chassis 100 are disposed.

Herein, reference will occasionally be made to the top, bottom, front, rear and lateral sides of the chassis 100. It should be understood that these terms refer generally to the locations or regions associated with sides or faces of the chassis 100. For example, references to the top, bottom, and lateral sides of the chassis 100 refer generally to the regions at or around the top 120, base pan 110, and lateral walls 112 and 114, respectively. References to the front section and rear section of the server chassis may refer generally to the other two sides of the chassis 100 which are perpendicular and tangent to the top, base pan, and lateral walls 120, 110, 112, and 114.

As shown in FIG. 1B, mounting tray 150 comprises a plate 150 and mounting elements 131 coupled to and extending from a bottom side of the plate 150. The mounting elements 131 comprise protruding mounting elements, such as spools, studs, rails, brackets, or other protruding mounting elements which are complementary to (i.e., configured to be received in or otherwise engage with) the mounting elements 132 of the base pan 110. The mounting elements 131 are arranged in a predetermined pattern of attachment locations on the mounting tray 150 such that each of the mounting element 131 is aligned with a corresponding one of the mounting elements 132 of the base pan 132. In some examples, the mounting tray 150 may have fewer mounting elements 131 than there are mounting elements 132 in the base pan 132, in which case the mounting elements 131 engage with a subset of the mounting elements 132. In other examples, the mounting tray 150 may have the same number of mounting elements 131 as mounting elements 132 in the base pan 132, in which case the mounting elements 131 engage with all of the mounting elements 132.

In some examples, different versions of the mounting trays 150 may have different arrangements (i.e., different numbers and/or different positions) of mounting elements 131 relative to one another, such that different ones of mounting trays 150 may couple with different groups of the mounting elements 132. For example, a first mounting tray 150 may engage with all of the mounting elements 132, while a second mounting tray 150 engages with only a subset of the mounting elements 132. As another example, a third mounting tray 150 may engage a first subset of the mounting elements 132 while a fourth mounting tray 150 may engage a second subset of the mounting elements 132 different from the first suggest (i.e., at least one member of the first subset is not present in the second subset, or vice versa). In this manner, a plurality of different versions of the mounting tray 150 can be used with the same base pan 110, as noted above.

The mounting tray 150 may be configured to receive a printed circuit assembly 170 mounted thereon, as will be described in greater detail below with reference to FIG. 1D. The mounting tray 150 is formed as a flat plate out of a suitable structural material, such as described above, and having width and depth dimensions similar to the dimensions of the base pan 120. In one example, the mounting tray 150 may be formed out of steel having a thickness of 0.80 mm, a width of 40.00 cm, and a depth of 50.00 cm.

As shown in FIG. 1C, a mechanical assembly 101 comprises the chassis 100 with one of the mounting trays 150 attached to the base pan 110. In this state, the mounting tray 150 is attached parallel to the inner surface of the base pan 110 using a set of mechanical fasteners 130. As noted above, each one of the mechanical fasteners 130 includes two elements, a first element 131 included on the mounting tray 150, and a second element 132 included on the base pan 110. The mechanical fasteners 130 are positioned at a plurality of locations around the planar surface of the mounting tray 150 and corresponding locations around the planar surface of the base pan 110. The type of attachment mechanism used by mechanical fasteners 130 that the base pan 110 lacks any protrusions (that is, the base pan 120 remains relatively flat). As a result, the base pan 110 can accommodate a multiple different versions of the mounting tray 150 using different positional arrangements of the mechanical fasteners 130. In other words, different groups (e.g., subsets) of the mounting elements 132 may engage with the respective mounting elements 131 of the different mounting trays 150, which may be positioned at different locations around the planar surface of the different mounting trays 150, without interference during attachment of the different mounting tray 150.

As an example, each of the set of mechanical fasteners 130 comprises a first element 131 included on the mounting tray 150 in the shape of a spool extending from the bottom surface of the mounting tray 150. The spool includes a barrel and a flange. In these examples, each of the set of mechanical fasteners 130 further comprises a second element 132 included on the base pan 110 in the shape of keyhole opening in the base pan 110. Each of the keyhole openings, or keyholes, includes an entry hole and a slot extending from the entry opening. The base pan 110 may include additional keyholes to accommodate different mounting trays with different spools as part of the set of mechanical fasteners. The mounting tray 150 attaches to the base pan 110 by engaging the set of spools with a corresponding set of keyholes, respectively. Specifically, the flange of each spool of the set of spools is inserted through the entry hole of a corresponding keyhole of the set of keyholes, the first mounting tray 150 is moved relative to the base pan such that the barrel of each spool of the set of spools is received within the slot of the corresponding keyhole and the flange of each spool of the set of spools is engaged with and secured by a rim of the slot of the corresponding keyhole of the set of keyholes.

As shown in FIG. 1D, an electronic device 102 comprises the mechanical assembly 102 and a printed circuit assembly 170 mounted on the top surface of the mounting tray 150 (i.e., the surface opposite or distal from the base pan 110). In some examples, the electronic device 102 is a server, a networking device, or other information technology (IT) equipment. In some examples, the printed circuit assembly 170 comprises a processor, a memory, power supply components, switching circuitry, microcontrollers, or any other electrical components, as would be familiar to those of ordinary skill in the art. As shown, one printed circuit assembly 170 is present, however, mounting tray 150 may be configured to include more than one printed circuit assembly similar to printed circuit assembly 170. In some examples, the chassis 100 may comprise more than one such mounting tray 150 mechanically coupled to the base pan 110 concurrently at different locations. In some examples, the printed circuit assembly 170 may be attached to the mounting tray 150 prior to the mounting tray 150 being attached to the base pan 110.

For convenience, the chassis 100, mounting tray 150, mechanical assembly 101, and electronic device 102 are described herein relative to the orientation shown in FIGS. 1A-1D in which the base pan 110 and mounting tray 150 are generally horizontal, and directional terms such as "lateral," "top", "bottom" and so on are used herein relative to this illustrated orientation. For example, the base pan 110 is described herein as being coupled to the "lateral sides" (or lateral walls 112 or 114) of the chassis 100. This may be referred to herein as a horizontal configuration. It should be understood that "horizontal" in this context refers to the illustrated orientation but implies no limitation as to how the devices may be oriented relative to an external reference frame such as the earth or ground. However, it should be understood that the system chassis 100 could be oriented differently, for example with base pan 110 and mounting tray 150 extending vertically relative to the earth or ground. This may be achieved, for example, by rotating the entire chassis 100 by 90 degrees. The principles of the present disclosure may equally apply regardless of the orientation of the chassis 100, with the base pan 110 and mounting tray 150 oriented in a vertical direction relative to the earth or ground, referred to as a vertical configuration. In such implementations in which the chassis 100 has different orientations than those illustrated, it should be understood that the directional terms used herein would be translated accordingly, e.g., that which is described as located on a "lateral side" of the chassis 100 in relation to the horizontal configuration shown in FIG. 1 may be located on a "top" or "bottom" side of the chassis 100 in a vertical configuration.

Figure 2:
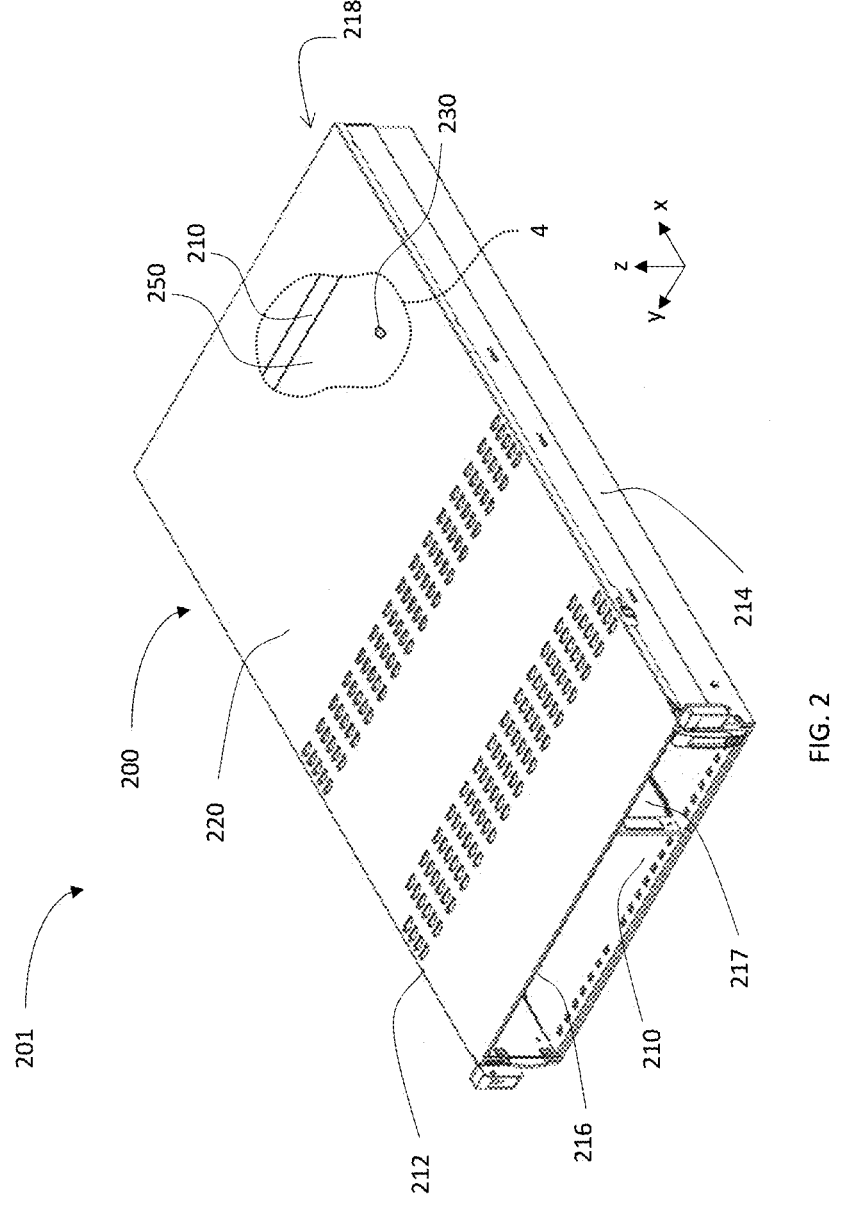
FIG. 2 is a perspective view of mechanical assembly comprising a server chassis and a mounting tray.
Figure 3:
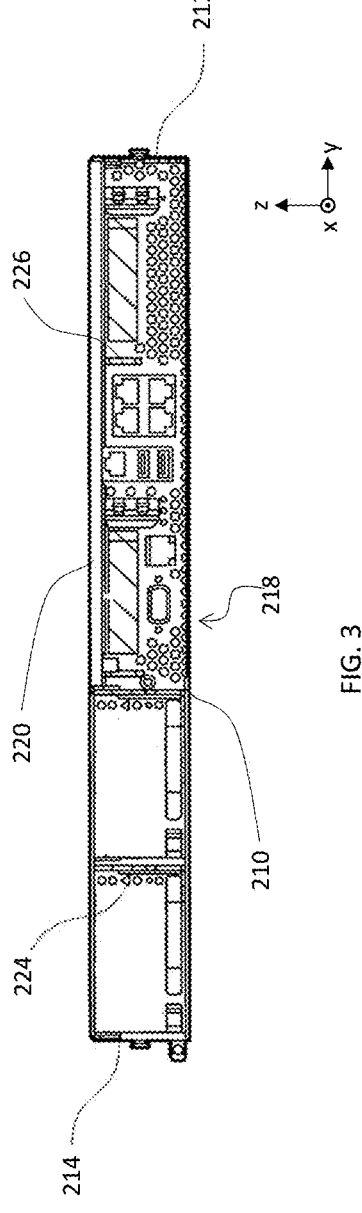
FIG. 3 shows a rear view of the server chassis in FIG. 2.
Figure 4:
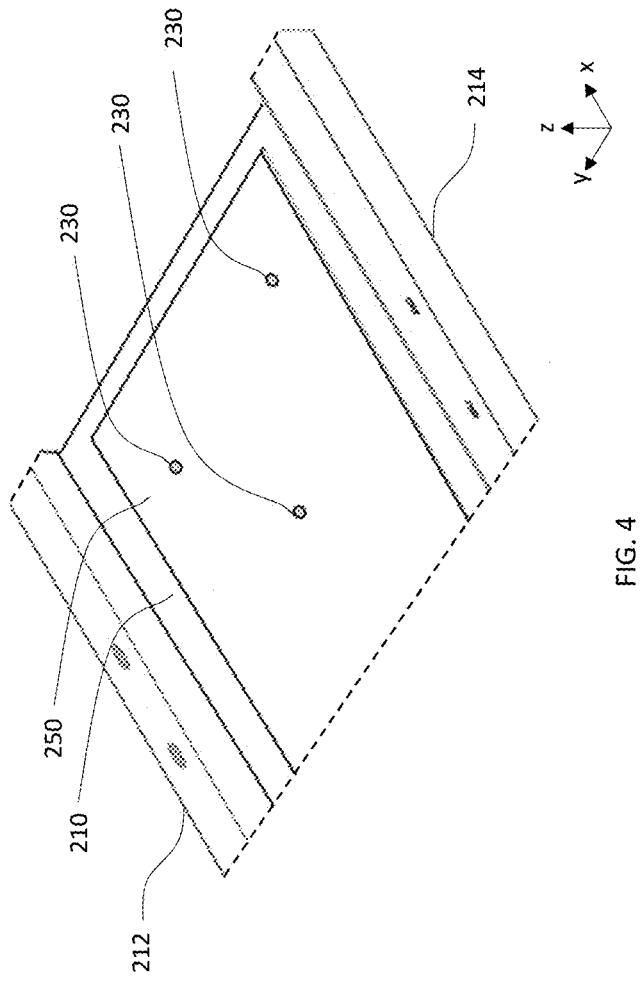
FIG. 4 is a perspective view of a portion of the mechanical assembly in FIG. 2 with the top of the server chassis removed.

Turning now to FIGS. 2-4, a mechanical assembly 201 comprising a server chassis 200 and mounting tray 250 in accordance with various aspects of the disclosure will be described. The server chassis 200 and mounting tray 250 may be example configurations of the chassis 100 and mounting tray 150 described above, respectively. Thus, various components of the server chassis 200 and mounting tray 250 may be similar to components of the chassis 100 and mounting tray 150 described above. The above descriptions of components of the chassis 100 and mounting tray 150 are applicable to the similar components of the server chassis 200 and mounting tray 250, and thus duplicative descriptions are omitted below to improve clarity. Similar components of the are given reference numbers having the same last two digits, such as 110 and 210. Although the server chassis 200 and mounting tray 250 may be example configurations of the chassis 100 and mounting tray 150, the chassis 100 and mounting tray 150 are not limited to the configurations of server chassis 200 and mounting tray 250.

FIGS. 2 and 3 show a perspective view of the front of server chassis 200 and a rear view of the server chassis 200 respectively. In FIG. 2, a portion 4 of the top 220 is made transparent to show other components housed within chassis 200. The server chassis 200 comprises a base pan 210, lateral walls 212 and 214 and a top 220. The base pan 210, lateral walls 212 and 214, top 220 are formed from one or more steel sheets. The server chassis 200 also comprises a front section 216 (not shown in FIG. 3) that is open. Optionally, the chassis 200 may comprise one or more internal walls, dividers, or other structures to define different regions or compartments. For example, an optional divider wall 217 is illustrated in FIG. 2 extending between the base pan 210 to the top 220 from the front section 216 inward in a direction parallel to the lateral walls 212 and 214. Although not shown, the divider wall 217 extends for a portion of the depth of the server chassis 200. The divider wall 217, along with lateral wall 214, base pan 210, and top 220, forms a receptacle that can be used for insertion and attachment of external devices to the server chassis, such as memory cards or hard disk drives. The server chassis 210 also comprises a rear section 218 (not shown in FIG. 2) that may comprise one or more panels or panel assemblies. For example, in one implementation the rear section 218 is partially covered with a first panel 224 used as a cover with perforations for ventilation, and the remainder of the rear section 218 comprises a rear panel assembly 260. The rear panel assembly 260 has a set of openings that are configured to accept or expose one or more electrical interface connectors used for connecting external devices to electronic circuits (not shown) included inside the server chassis 200.

FIG. 4 shows a perspective view of a portion of the server chassis 200 with the top 120 removed in order to show the configuration of the mounting tray 250 with the base pan 210. The mounting tray 250 is mechanically attached to the base pan 210 using the mechanical fasteners 230, which are example configurations of the mechanical fasteners 130. In FIGS. 2 and 4, only part (i.e., a top portion) of each mechanical fastener 230 is visible, but additional aspects of the mechanical fasteners 230 are illustrated in FIGS. 5-11 and described in greater detail below. Additional mechanical fasteners 230 may be present but shown in FIG. 4. In other examples, more or fewer mechanical fasteners 230 may be used.

The mounting tray 250 is shown as having dimensions that are smaller in width and depth than the base pan 210. In other examples, the mounting tray 250 may extend fully to the lateral walls 212 and 214 and/or to the rear section 218. In some examples, the mounting tray 250 may include lateral walls similar to lateral walls 212 and 214 and may further include a mechanism for attachment to the one or both of lateral walls 212 and 214. In some examples, a printed circuit assembly (not shown) is attached or mounted to the mounting tray 250 and includes one or more electrical interface connectors or other connectors (e.g., optical connectors) that are disposed at, or extend through, the rear panel assembly 260.

In some examples, the rear panel assembly 260 may be attached to the mounting tray 250. This may allow for openings in the rear panel assembly 260 to be more precisely positioned relative to a printed circuit assembly mounted to the mounting tray, such that the openings in the rear panel assembly 260 are aligned with corresponding connectors of the printed circuit assembly. In some examples, some or all of the connectors may be coupled to the rear panel assembly 260 at or in the corresponding openings, and in some examples some or all of the connectors may be aligned with or extend through the corresponding openings in the rear panel assembly 260 without necessarily being coupled directly thereto.

Turning to FIGS. 5-11, the mechanical fasteners 230 are described in greater detail. Each mechanical fastener 230 comprises a combination of a spool 500 and a corresponding keyhole 550. The spool 500 is attached to the mounting tray 250 (see FIG. 7) and the keyhole 550 is formed in the base pan 210 (see FIG. 8), and a spool 500 engages with a corresponding keyhole 550 to attach the mounting tray 250 to the base 210 in a server chassis 200 (see FIG. 10). The spool 500 and keyhole 550 represent a possible fastening configuration for the set mechanical fasteners 230 described above. Further, the shapes described, and dimensions provided, represent one configuration for the spool 500 and keyhole 550. Other configurations, using different shapes and dimensions are possible. One or more of FIGS. 5-11 may reference other components in a chassis, such as the mounting tray 250 and base 210 in server chassis 200, and thus duplicative descriptions of these components are omitted below to improve clarity.

Figure 5:
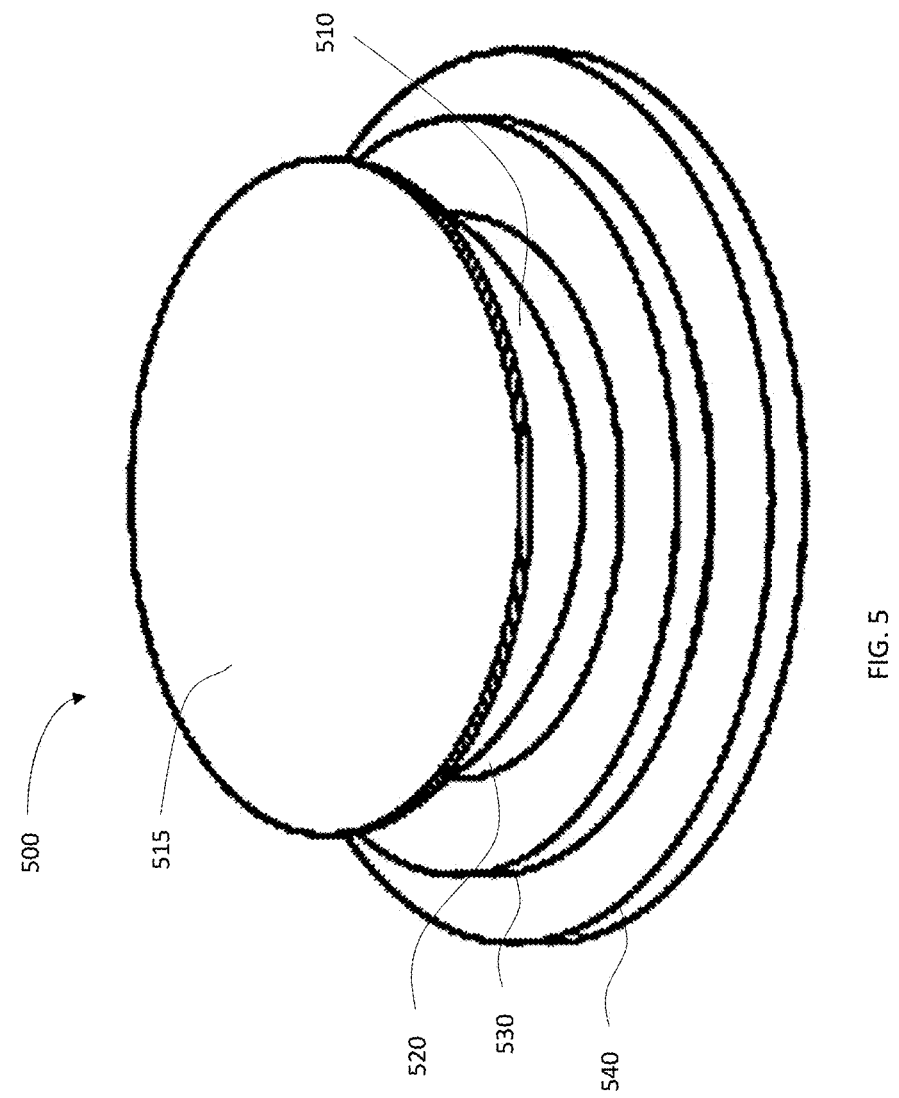
FIG. 5 a perspective view of a spool of the mounting tray in FIG. 2 in isolation.
Figure 6:
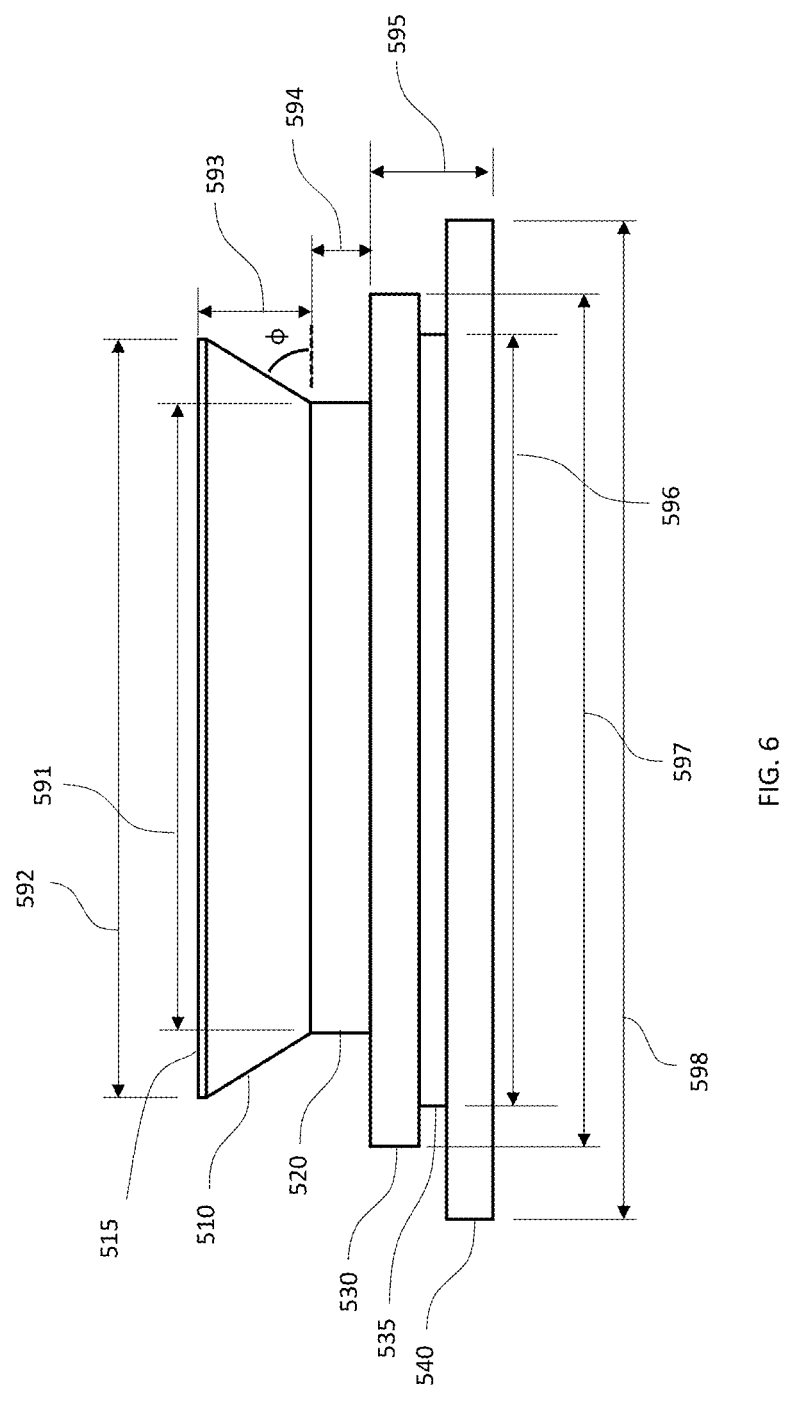
FIG. 6 is a side view of the spool in FIG. 5.

FIGS. 5 and 6 are a side view and perspective view of a spool 500, respectively. The spool 500 can be formed out of a suitable structural material. Suitable structural materials include, but are not limited to, metals such as steel, nickel, zinc, copper, brass, aluminum, or other relatively rigid materials such as plastics. In one example, the spool 500 is formed out of brass.

Spool 500 includes a barrel 520 spanning the middle section of the spool. The barrel 520 is tubular in shape having a diameter 591 and a length 594. Spool 500 further includes a flange 510. The flange 510 is located at one end of the barrel 520 and the flange 510 has a diameter 592 at a widest point thereof which is a larger than a diameter 591 of the barrel 520. Moreover, the diameter 592 of the flange 510 at its widest point is greater than a width of a slot 570 of the keyhole 550 and smaller than the diameter of entry hole 560 of the keyhole 550, thus allowing the flange 510 to be inserted through the keyhole but preventing the flange 510 from passing through the slot 570. Furthermore, the diameter 591 of the barrel 520 is smaller than the width of the slot 570, thus allowing the barrel to be inserted into the slot 570. In some examples, the flange 510 is conical in shape with an inward taper from its distal or end face 515 (i.e., the base of the conical shape) towards the one end of the barrel 520. In examples in which the flange 510 is tapered, the end of the flange 510 that is coupled to the barrel 520 has the same diameter 591 as the barrel 520 while an opposite end of the flange 510 at the distal face 515 has a larger diameter 592. In one example, the diameter 591 may be 4.18 mm and the larger diameter 592 may be 5.00 mm.

The flange has a length 593 measured parallel to the length 594 of the barrel 520. The combined length 594 for the barrel 520 and the length 593 of the flange 520 are, in some examples, notably similar to the thickness of the base pan 210 resulting in distal face 515 being approximately flush with a bottom surface of base pan 210 when the spool 500 is engaged with a corresponding keyhole 550. In one example, the length 594 may be 0.40 mm and the length 593 may be 0.80 mm, resulting in a combined length of 1.20 mm, and in some examples the thickness of the base pan 210 is also 1.20 mm. In some examples, the flange 520 is two thirds (⅔) the thickness of the base pan 210 and the barrel 510 is one third (⅓) the thickness. In other examples, the combined lengths of the flange and barrel (lengths 594 plus length 593) is less than the thickness of the base pan 210, resulting in the distal face 515 being offset (e.g., recessed) relative to the bottom surface of the base pan 210. In still other examples, the combined lengths of the flange and barrel (lengths 594 plus length 593) is greater than the thickness of the base pan 210, resulting in the distal face 515 protruding beyond a bottom surface of the base pan 210.

Notably, the inward taper of the flange 510 forms an angle phi (φ) with respect to a line perpendicular to the length 594. In one example, the angle φ may be 45 degrees. Although spool 500 is described as having a particular shape and dimensions for the barrel and the flange, other shapes and/or other dimensions for the barrel and the flange are possible. For example, in some implementations the angle φ is greater than 45 degrees, while in other implementations the φ is less than 45 degrees. In some implementations, the flange 510 has no inward taper; in other words, φ is zero degrees.

The specific dimensions and proportions described above and illustrated in in the figures are merely examples, and it should be understood that the same principles described herein are applicable regardless of the dimensions of the spool 500, as long as the spool 500 can engage the corresponding keyhole 550 (e.g., as long as the widest diameter of the flange 510 is greater than a width of a slot 570 of the keyhole 550 and smaller than the diameter of entry hole 560 of the keyhole 550, and the diameter of the barrel 520 is smaller than the width of the slot 570).

Spool 500 further includes an inner ring 530 and outer ring 540. Inner ring 530 and outer ring 540 provide an attachment mechanism to affix the spool 500 to the mounting tray 250. The inner ring 530 and outer ring 540 are both shown as tubular in shape having diameters 597 and 598 respectively. As shown, the diameter of the outer ring 540 is greater than the diameter of the inner ring 530. In one example, diameter 597 may be 5.60 mm and the diameter 598 may be 6.00 mm. A step 535 is shown between the inner ring 530 and outer ring 540 having a diameter 596. As shown, the diameter 596 of the step 535 is less than the diameter of the inner ring 530. In one example, the diameter 596 may be 5 mm. The inner ring 530, step 535, and outer ring 540, combined, have a length 595, similar to the thickness of the mounting tray 250. In one example, the length 595 may be 0.80 mm.

Figure 7:
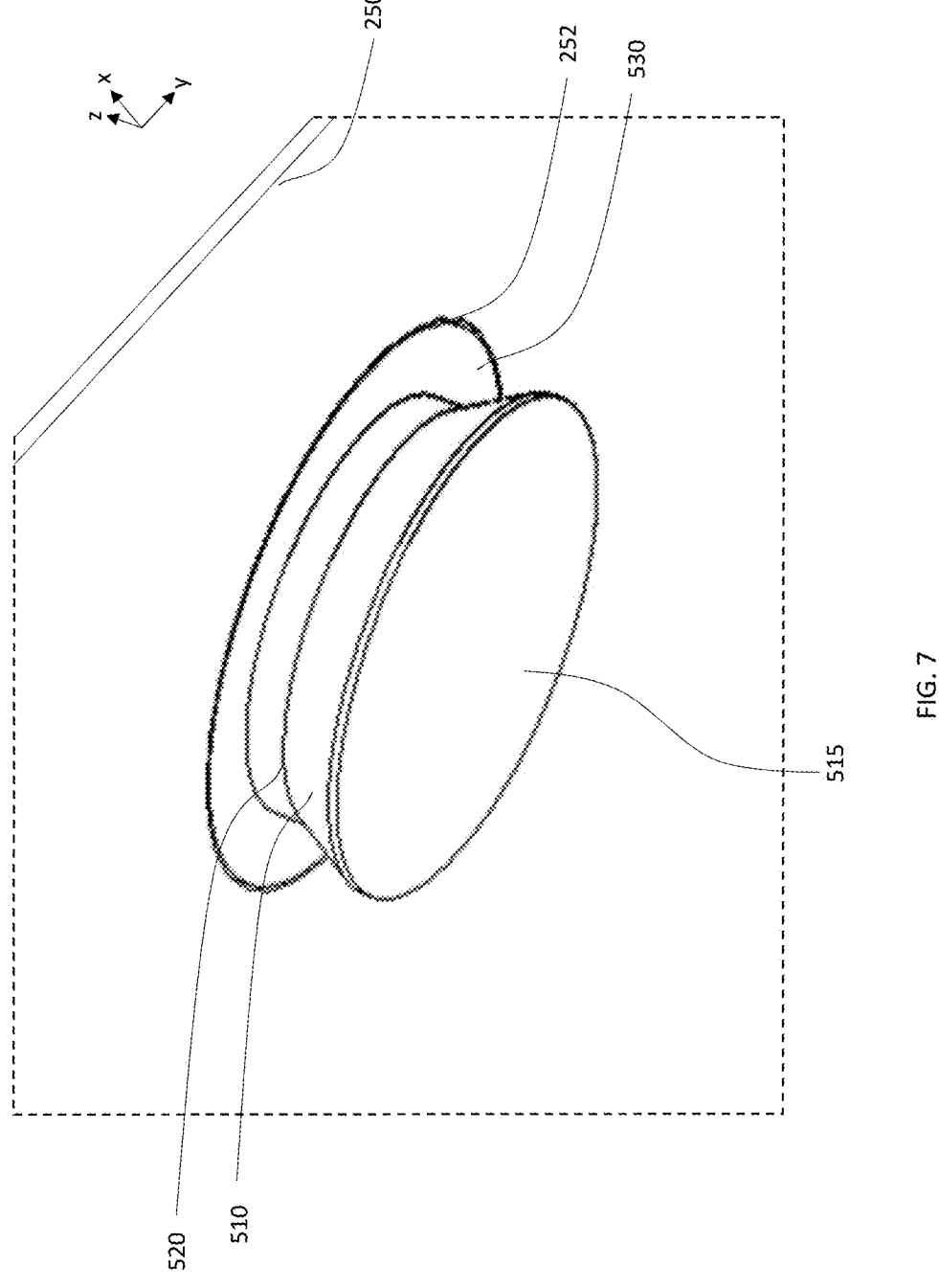
FIG. 7 is a perspective view of a portion of the mounting tray in FIG. 2 comprising the spool in FIG. 5.
Figure 11:
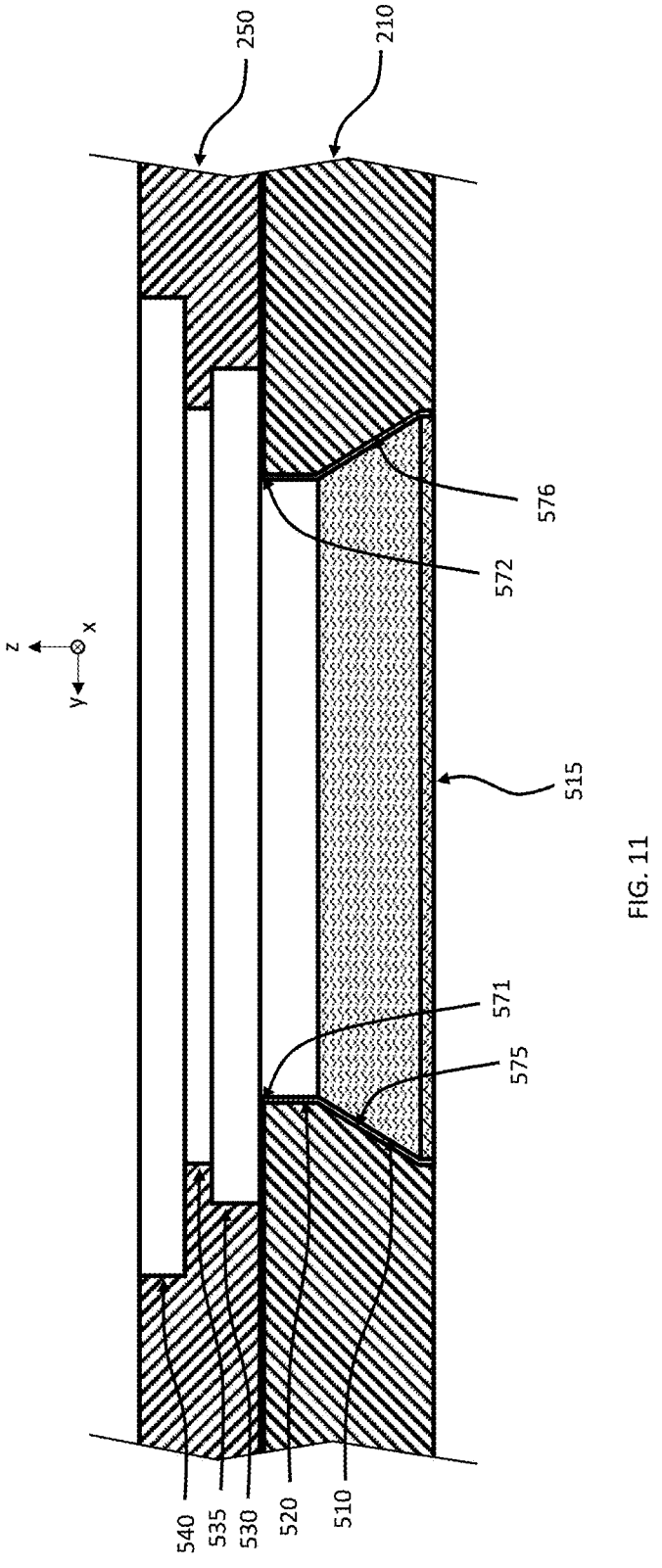
FIG. 11 is a cross-section view of the mechanical assembly of FIG. 10 with the spool disposed in the keyhole, with the section taken along 11-11 in FIG. 10.

FIG. 7 shows a bottom perspective view of the spool 500 mounted to a mounting tray 250. The barrel 520 and flange 510 are shown extending from the lower surface of the mounting tray 250. The mounting tray 250 includes a mounting hole 252 having a diameter similar to the diameter of the inner ring 530 (e.g., 5.60 mm). The inner ring 530 and outer ring 540 are affixed to the mounting tray 250 to prevent the spool 500 from being pulled out of the mounting tray 250 during assembly to the base pan. To affix the spool 500 to the mounting tray 250, the flange 520 is passed through the mounting hole 252 from the upper surface of mounting tray 250 (i.e., the side opposite the lower surface) until the inner ring 530 is in contact with the rim of the mounting hole 252. Pressure is applied on the outer ring 540 until the inner ring 530 is disposed into the mounting hole 252 with the outer ring 540 in contact with the rim of the mounting hole 252. This results in the configuration shown in FIG. 11, in which the outer surface of the outer ring 540 is adjacent to (in some cases, flush with) the top surface of mounting tray 250 and the bottom surface of the inner ring 530 is adjacent to (in some cases, flush with) the bottom surface of the mounting tray 250. Although the surfaces are illustrated in FIG. 11 as flush, in some examples, some or all of the outer ring 540 may be higher or lower than the top surface of the mounting tray 250, and similarly some or all of the inner ring 530 may be higher or lower than the bottom surface of the mounting tray 250. Although spool 500 is described as using a particular attachment mechanism for attaching or affixing the spool 500 to the mounting tray 250, other attachment mechanisms are possible. In some examples, the attachment mechanism may use a screw and washer threaded into the spool 500, a threaded rod in the spool 500 and a nut, a rivet inserted in a hole in the spool 500, and the like.

Figure 8:
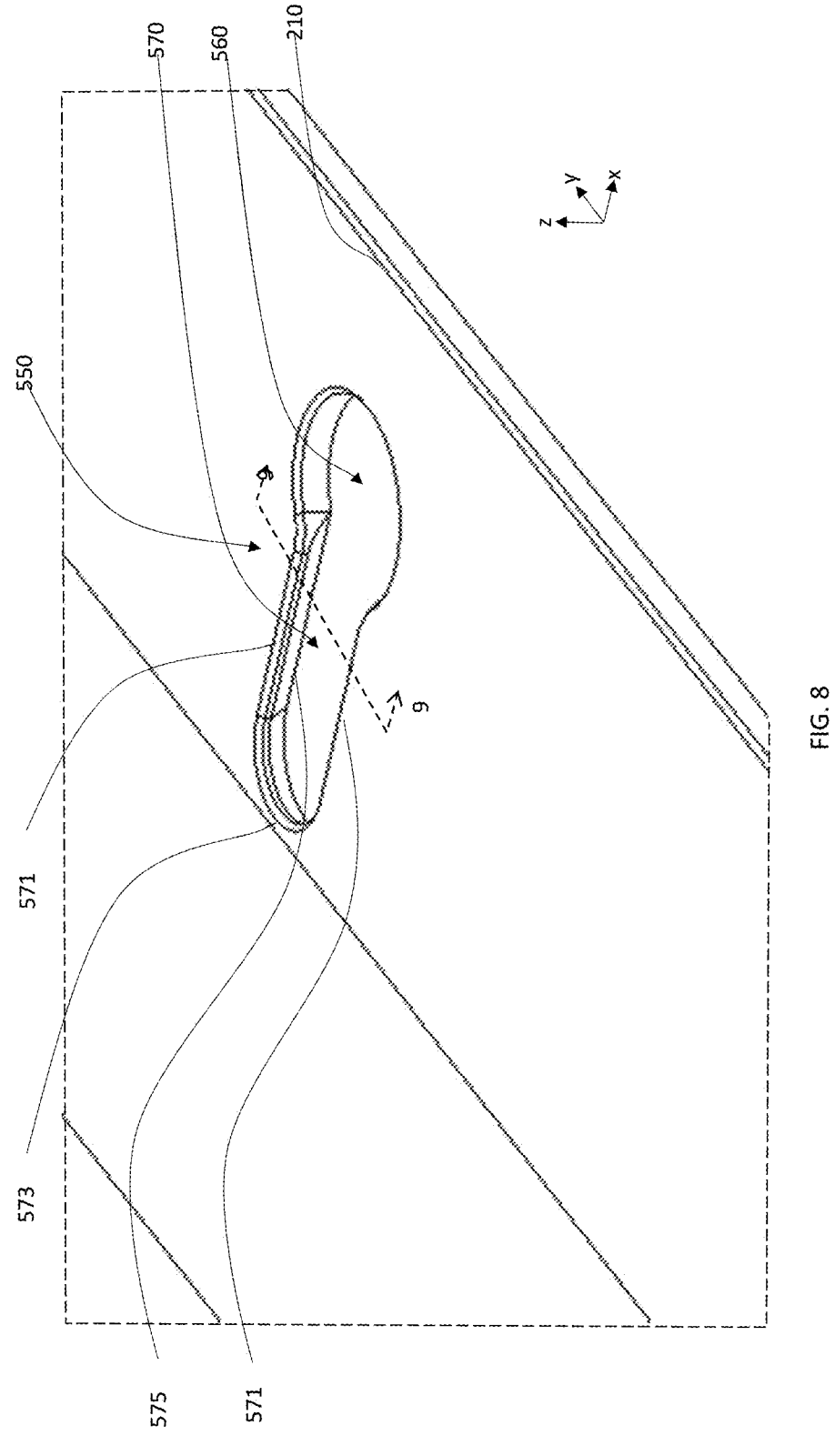
FIG. 8 is a perspective view of a portion of a base pan of the server chassis in FIG. 2 comprising a keyhole.
Figure 9:
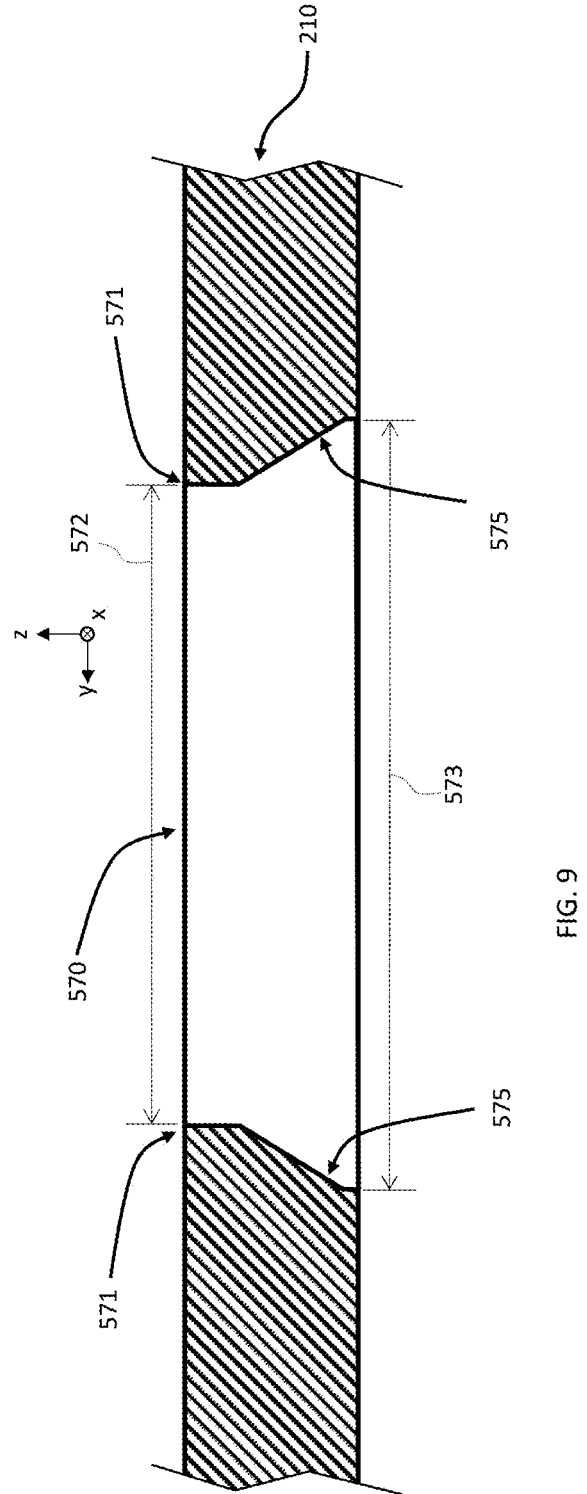
FIG. 9 is a cross-section view of a portion of the base pan in FIG. 8 near the keyhole, with the section taken along 9-9 in FIG. 8.

FIG. 8 and FIG. 9 shows a perspective view and cross-section view, respectively, of the base pan 210 showing a keyhole 550 included on (in) the base pan 210. Keyhole 550 includes an entry hole 560. The entry hole 560 is circular in shape and has a diameter larger than the diameter 592 of the flange 510 in order to allow the flange 510 to pass through the entry hole 560. Keyhole 550 also includes a slot 570. The slot 570 has an edge 571 on the upper surface of the base pan 210. The edge 571 starts at one end, at the entry hole 560 and extends, along both sides of slot 570, to a closed end 573 that is semicircular in shape. The width 572 of the slot 570 at its narrowest point is larger than the diameter 591 of the barrel 520 but smaller than the diameter 592 of the flange 510. In some examples, the width 573 of the slot 570 at its widest point is equal to or slightly larger than the diameter 592 of the flange 510. Slot 570 also has a lower rim 575 on the lower surface of the base pan 210. The lower rim 575 similarly starts at one end, at the entry hole 560 and extends, along both sides of slot 570, to the closed end 573. The lower rim 575 is configured to abut the flange 510 of a barrel 500 when the barrel 500 is engaged with the keyhole 550, and because the width 572 is smaller than the diameter 592 the lower rim 575 prevents the flange 510 from being pulled upward through the slot 570. In examples in which the flange 510 is tapered, the lower rim 575 is chamfered inward for a portion of the thickness of the base pan 210 such that the angle of the chamfer and the dimension for the length of the chamfer match and complement the angle and dimension 593 for length of the flange 510. Further, the non-chamfered portion of the base pan 210 in the slot 570 has a dimension, relative to the thickness of the base pan 210, that is similar to the dimension 594 for the length of the barrel 520. In one example, for a base pan thickness of 1.00 mm, the rim 575 is chamfered at a 45 degree angle for 0.80 mm and non-chamfered for 0.40 mm. In other words, in some examples, the rim 575 is chamfered for a distance of two thirds the thickness of the base pan. Notably, other shapes and dimensions for keyhole 550 depending on the shapes and dimensions used for the spool 500. In examples in which the flange 510 is not tapered, the lower rim 575 may from a horizontal (non-chamfered) ledge or shelf that abuts the horizontal (non-tapered) flange 510.

Figure 10:
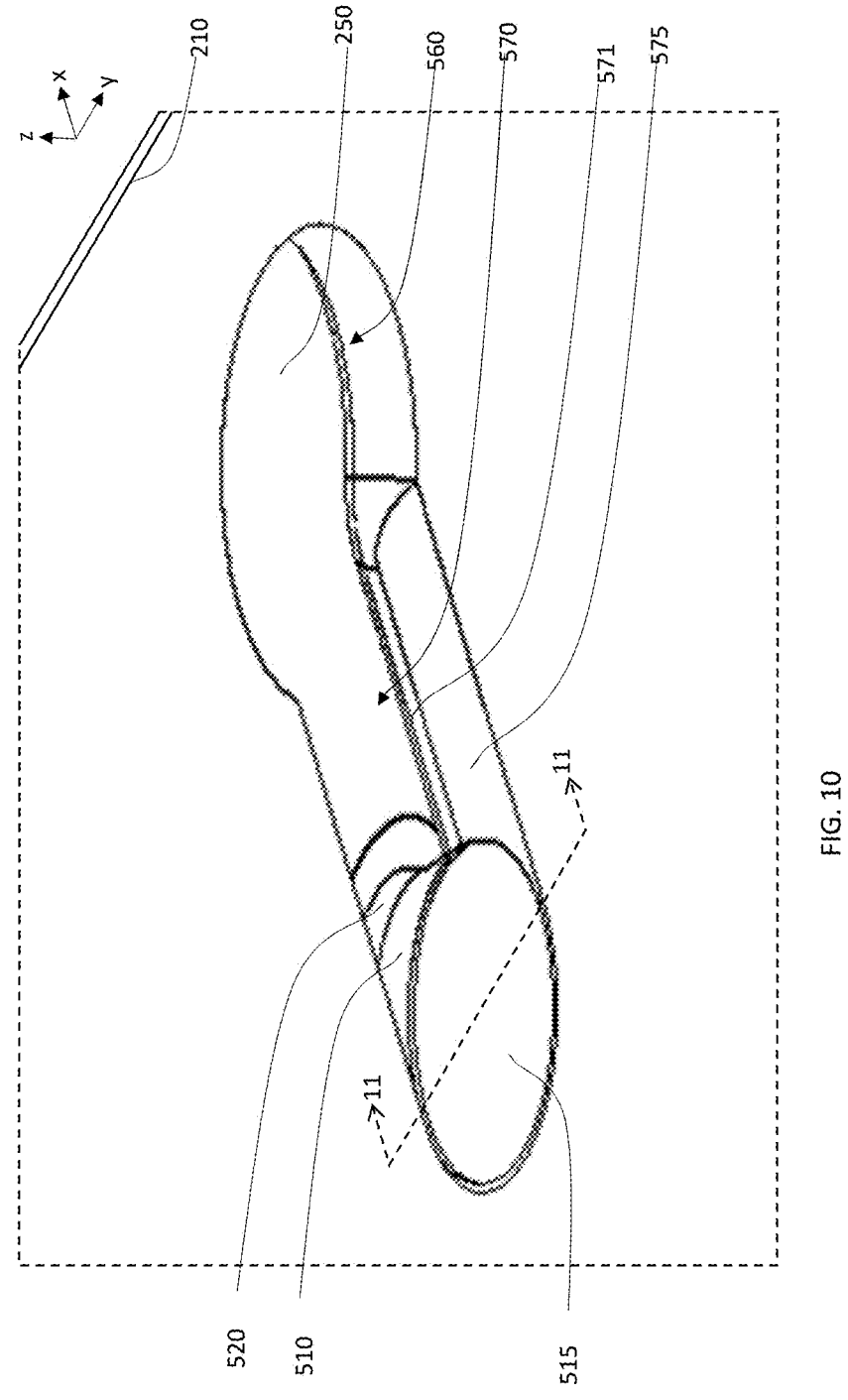
FIG. 10 is a perspective view of a portion of the mechanical assembly of FIG. 2 with the spool of the mounting tray in FIG. 7 disposed into the keyhole of the base pan in FIG. 8.

FIGS. 10 and 11 are a perspective view and a cross-section views, respectively, of the base pan 210 and mounting tray 250 with one of the spools 500 disposed into a corresponding one of the keyholes 550 (specifically, in the slot 570 of the keyhole 550) as part of assembling the mounting tray 250 to the base pan 210. In order to engage the spool 500 in the keyhole 550, the flange 510 is inserted through the entry hole 560, i.e., from an initial position of the flange 510 above base pan 210 and aligned with the entry hole 560, the flange 510 is moved downward (in a −z direction in FIG. 10) through the entry hole 560 toward the bottom side of the base pan 210 (e.g., in some examples, until the distal face 515 of the flange 510 is flush with the bottom side of the base pan 210). The mounting tray 250 is moved or adjusted relative to the base pan 210 in such a way so that the barrel 520 and flange 510 are received within the slot 570, i.e., the barrel 520 is translated (e.g., in a −x direction in FIG. 10) along all or part of the length of the slot 570. As shown in FIG. 10 and FIG. 11, the mounting tray 250 is moved so that the barrel 520 and flange 510 are disposed all the way to the closed end 573 of slot 570. In the illustrated example, the inward taper of the flange 510 matches the inward chamfer from the rim 575 of slot 570. Additionally, in the illustrated example, the distal face 515 of the flange 510 is flush with the outer or bottom surface of the base pan 210. In other examples, the flange 510 may protrude below the bottom surface of the base pan 210, or in other examples may be positioned above the bottom surface of the base pan 210.

Figure 12:
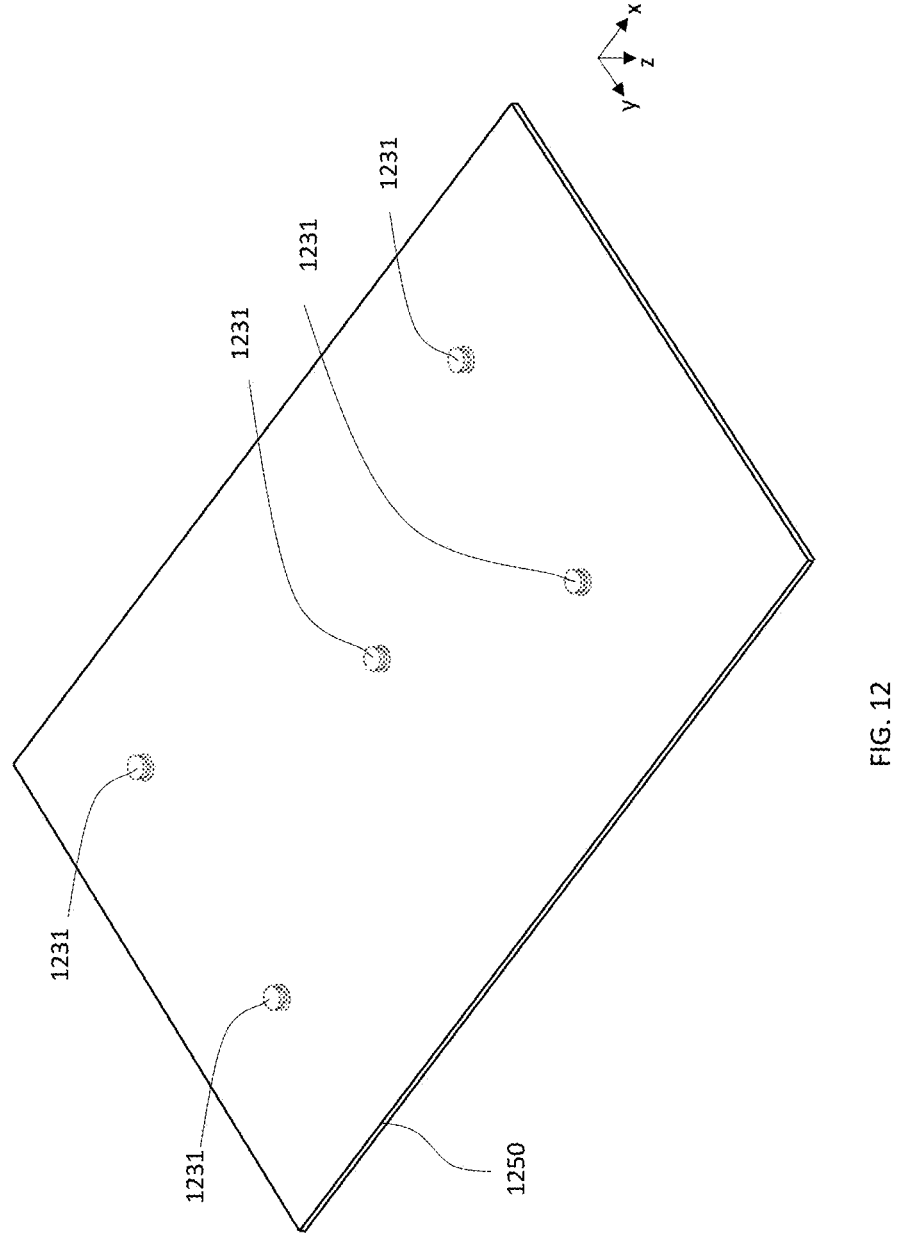
FIG. 12 is a perspective view of another mounting tray.
Figure 13:
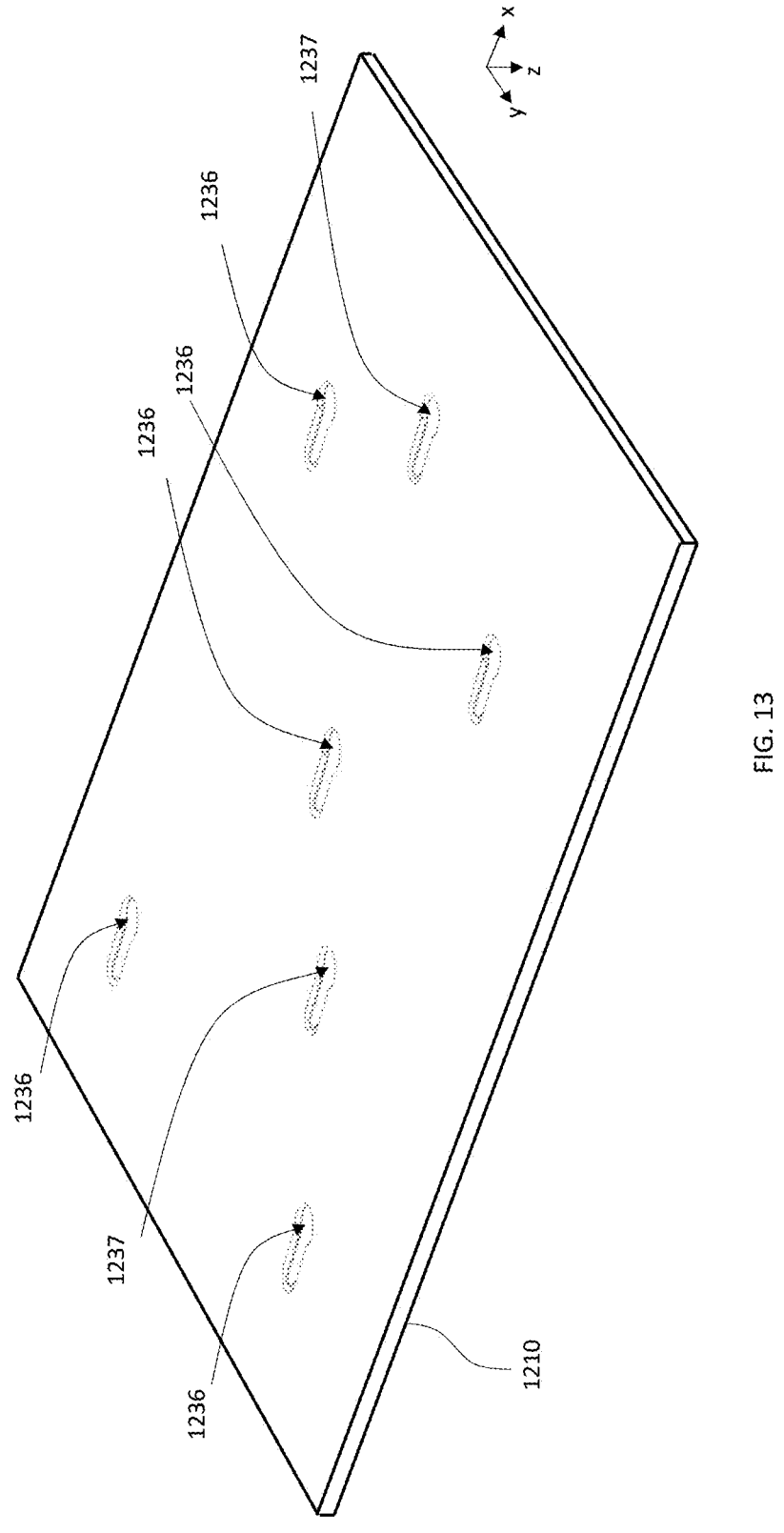
FIG. 13 is a perspective view of another base pan.
Figure 14:
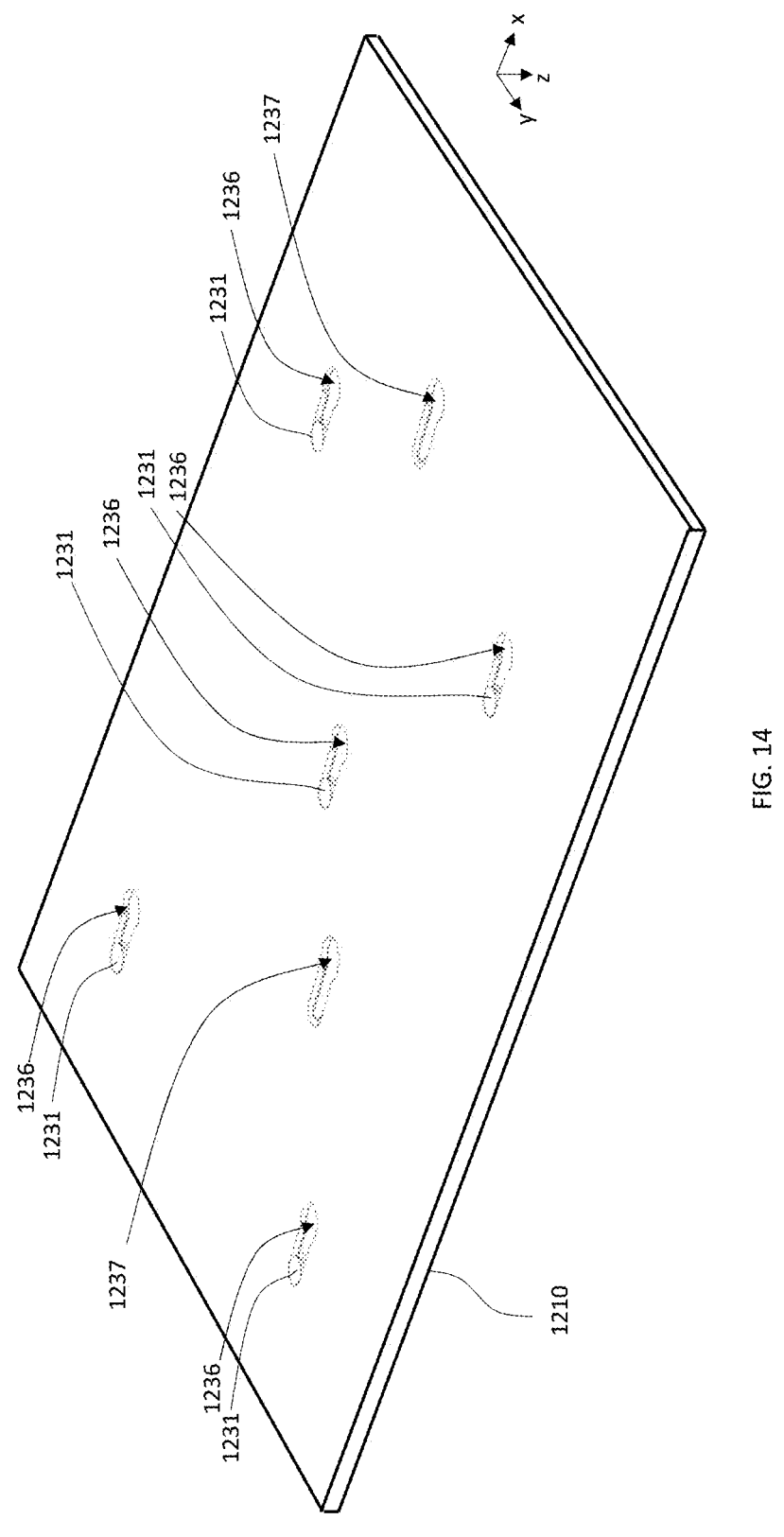
FIG. 14 is a perspective view of the mounting tray in FIG. 12 attached to the base pan in FIG. 13.

Turning now to FIGS. 12-14, a mounting tray 1250, base pan 1210, and the assembled combination of the mounting tray 1250 and base pan 1210 in accordance with various aspects of the disclosure will be described. The base pan 1110 may be included in a chassis similar to chassis 100 or server chassis 200 described above and may be one example configuration of the base pan 110 or 210. Furthermore, the mounting tray 1250 may be an example configuration of the mounting trays 150 and 250 described above. Specifically, as shown FIG. 13, the base pan 1210 has a plurality of keyholes 1236 and 1237 and the mounting tray 1250 comprises a plurality of spools 1231. Each of the keyholes 1236 and 1237 and spools 1231 are similar to the keyhole 550 and spool 500 described above in FIGS. 5-11 and thus duplicative descriptions of these components are omitted below to improve clarity. The combination of the keyholes 1236 and the spools 1231 are used for attaching the mounting tray 1250 to the base pan 1210. The keyholes 1237 are not used for attaching the mounting tray 1250 but are present to accommodate the mounting of different mounting trays to the base pan 1210. No other components, such as lateral walls, top, front and rear sections, and printed circuit assembly, as described above, are shown or described in order to improve clarity. In some examples, these components, as well as additional parts, that may be included as part of a server chassis utilizing the mounting tray 1250 and base pan 1210. Notably, the mounting tray 1250 and base pan 1210 are shown inverted in FIGS. 12-14, that is the mounting tray 1250 and base pan 1210 are shown as if a server chassis containing them is upside down with respect to the chassis 100 and 200 described above. The mounting tray 1250 and base pan 1210 are inverted to more clearly show the relationship between the spools 1231 and the keyholes 1236, 1237 which is most easily viewed from the bottom surface of both the mounting tray 1250 and base pan 1210.

FIG. 12 shows a perspective view of a mounting tray 1250. Mounting tray 1250 comprises a set of spools 1231 affixed to the mounting tray 1250 at different locations or positions. The specific combination of positions may be specific to one version of mounting tray that includes the mounting tray 1250 and not used by other versions of mounting trays that are also compatible with the base pan 1210. Other mounting trays may utilize a different combination of locations for one or more of the mounting spools used on those mounting trays. Note that this does not necessarily mean that a different version of mounting tray does not have any spools located at any of the positions at which the spools 1231 are located, but rather this means that the combination of spool positions (i.e., the constellation of positions considered collectively) of one type of mounting tray is not identical to the combination of spool positions of another type of mounting tray (i.e., they differ with respect to at least one spool position, but could be similar with respect to other spool positions). As shown, each of the spools 1231 have the same shape and dimensions. In some examples, one or more of the spools 1231 may have a different shape. In other examples, one or more of the spools 1231 may have different dimensions, such as a different diameter or length for the barrel, a different diameter or length for the flange, or a different angle for the inward taper on the flange.

FIG. 13 shows a perspective view of a base pan 1210. Base pan 1210 includes a set of keyholes 1236 and a set of keyholes 1237. Each of the set of keyholes 1236 is located or positioned proximate to the locations or positions of a corresponding one of the set of spools 1231 on the mounting tray 1250. None of the set of keyholes 1237 are located proximate to the locations for any of the set of spools 1231 and thus are not used as part of attaching the mounting tray 1250 to the base pan 1210. One or more of the keyholes 1237, as well as one or more of the set of keyholes 1236, may be used as part of attaching a different mounting tray to the base pan 1210, the different mounting tray having a different combination of spool positions. As such, each type of mounting tray compatible with the base pan 1210, including mounting tray 1250, may include a set of spools that correspond to a unique group of key holes (which may include all of the keyholes or a subset of the keyholes) from the sets of keyholes 1236, 1237. As shown, each of the keyholes 1236 and 1237 have the same shape and dimensions. Notably, one or more of the set of keyholes 1236 and set of keyholes 1237 can have a shape and/or dimensions that match the shape and/or dimensions of the corresponding spool on the mounting tray 1250.

FIG. 14 shows a perspective view of the mounting tray 1250 attached to the base pan 1210 using the set of spools 1231 disposed into the set of keyholes 1236. Each one of the set of spools 1231 is disposed into a corresponding one of the set of keyholes 1236. None of the set of spools 1231 are disposed into any of the set of keyholes 1237. As described above, one or more of the set of keyholes may be used in conjunction with a different mounting tray having a different set of spools. Notably, the inclusion of keyholes 1237 at the different positions or locations on the base pan 210 does not create any protrusions that interfere with attachment and/or assembly of the mounting tray 250 to the base pan 210. As a result, the base pan 210 can accommodate mounting trays having differing attachment location requirements without the creation interference between the different mounting trays as a result of the attachment mechanism described herein.

Figure 15:
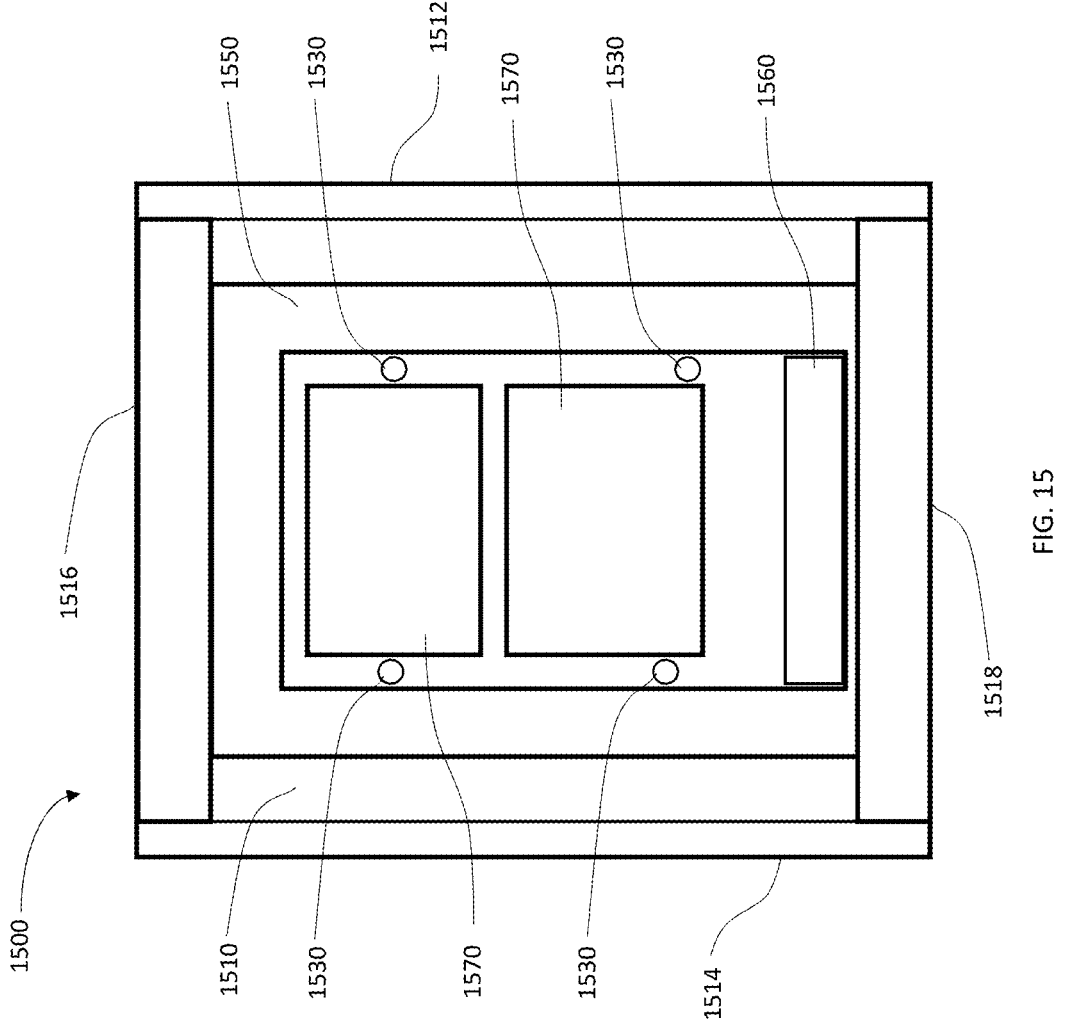
FIG. 15 is a block diagram illustrating an electronic assembly.

FIG. 15 is a block diagram conceptually illustrating an electronic assembly in the form of a server 1500 referred to as "server 1500". It should be understood that FIG. 14 is not intended to illustrate specific shapes, dimensions, or other structural details accurately or to scale, and that implementations of the server 1500 may have different numbers and arrangements of the illustrated components and may also include other parts that are not illustrated.

The server 1500 comprises a chassis 1505. The chassis 1505 may be similar to the chassis 100 and 200 described above. The chassis 1500 comprises a base pan 1510, two lateral walls 1512 and 1514, a front section 1516, and rear section 1518. In some examples, the server 1500 may comprise a lid or top (not shown). A mounting tray 1550 is shown attached to the base pan 1510 using a set of mechanical fasteners 1530. A set of printed circuit assemblies 1570 are shown attached to, or mounted on, the mounting tray 1550. Notably, two printed circuit assemblies 1570 are shown attached to, or mounted on, the mounting tray 1550. In other implementations, more or fewer printed circuit assemblies may be attached to the mounting tray 1550. Further, server 1400 may be configured to accommodate more than one mounting tray 1550 that can accommodate one or more printed circuit assemblies 1570.

The chassis 1505 can be formed out of a suitable structural material and configured in a manner similar to that described above. Further, the mounting tray 1550 can be attached to the base 1510 using mechanical fasteners 1530, such as a set of spools and a corresponding set or subset of keyholes, in a manner similar to that described above. Notably, the base pan 1510 is configured to attach to more than one mounting tray 1550, with each mounting tray having different sets of spools in potentially different locations or positions. Each of the mounting trays 1550 is attached to the base pan 1510 by inserting a flange of each of the different sets of spools into a corresponding entry hole of each of a different subset of keyholes on the base pan 1550. The use of spools on the mounting tray 1550 and keyholes on the base pan 1210 allow the base pan 1550 to remain relatively flat. As such, the base pan 1510 lacks any protrusions that can interfere with accommodating any of the different mounting trays 1550 that may be used.

Each of the printed circuit assemblies 1570 may be configured as an electronic device to carry out the same operations and/or functions or may be configured to carry out different operations and/or functions as part of the operation of the server 1500. Examples of different types of printed circuit assemblies include, but are not limited to, a motherboard assembly, a power supply board assembly, a memory board assembly, and network communication board assembly.

In some examples, the mounting tray 1550 further comprises a rear panel assembly 1560 that extends and is positioned into an opening in the rear section 1518. The rear panel assembly 1560 comprises one or more openings that are located to accept one or more electrical interface connectors from the printed circuit assembly 1570. The rear panel assembly 1560 may be attached to the mounting tray 1550 using a fastening mechanism or may be integral to the mounting tray (that is, formed out of the structural material). By having the rear panel assembly 1560 included as part of the mounting tray 1550, the arrangement of the openings may be specifically customized to the requirements of the printed circuit assembly 1570 included with the mounting tray 1510.

In some examples, server 1500 comprises an HPE Pro-Liant server, and HPE Apollo server, or other similar server. Server 1500 may be used as a standalone device or may be used as a server node as part of a multi-node parallel processing computer system. Further, although FIG. 15 describes an electronic assembly in the form of a server, the description herein may also be applied to other electronic assemblies in a computer system including, but not limited to a compute node, a switch node, and a storage node.

Figure 16:
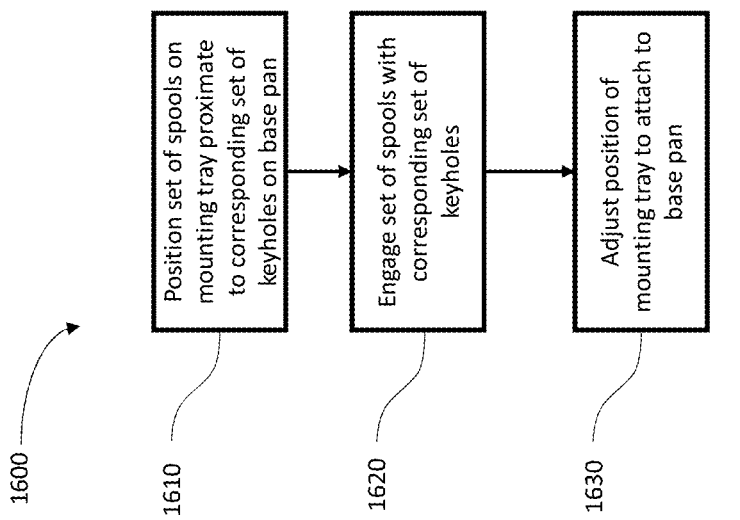
FIG. 16 is a process flow diagram illustrating an example process for attaching a mounting tray to a base pan of a chassis of an electronic device.

FIG. 16 describes an example process 1600 for attaching a mounting tray to a base pan, as part of assembling a chassis, such as server chassis 200. In block 1610, a set of spools, included on the mounting tray 250 are positioned or aligned proximate to a corresponding set of keyholes included on the base pan 210. The mounting tray 250 is positioned above and on top of the base pan 210 with respect to the orientation described in FIG. 1 such that each one of the set of spools may be partially or fully visible through the entry holes in each one the corresponding keyholes. Each of the set of spools may be similar to spool 500 and each of the set of keyholes may be similar to keyhole 550 described above. In some examples, the corresponding set of keyholes can be a subset of all of the keyholes that are included.

In block 1620, each one of the set of spools is engaged with the corresponding one of the set of keyholes, by inserting the flange of each spool through the entry hole of the corresponding keyhole. In block 1630, the position of the mounting tray 250 with respect to base pan 210 is adjusted such that the barrel of each spool of the set of spools is received within the slot of the corresponding keyhole. Additionally, the flange of each spool of the set of spools will be engaged with and secured by the rim of the slot of the corresponding keyhole, thereby attaching the mounting tray 250 to the base pan 210.

In some examples, the base pan 210 can be configured to attach to a different mounting tray having a different set of spools in place of mounting tray 250. The different mounting tray can be attached to the base pan 210 using the same process 1600 but using a different set of keyholes. Notably, the inclusion and presence of keyholes on the base pan 210 not used as part attaching the different mounting tray (i.e., keyholes used for attaching mounting tray 250 but not the different mounting tray) do not create an interference to the attachment of the different mounting tray.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

Further, spatial, positional, and relational terminology used herein is chosen to aid the reader in understanding examples of the implementations but is not intended to limit the implementation to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Thus, for example, the direction "up" in the figures does not necessarily correspond to an "up" in a world reference frame (e.g., away from the Earth's surface). Furthermore, if a different reference frame is considered than the one illustrated in the figures, then the spatial terms used herein may need to be interpreted differently in that different reference frame. For example, the direction referred to as "up" in relation to one of the figures may correspond to a direction that is called "down" in relation to a different reference frame that is rotated 180 degrees from the figure's reference frame. As another example, if a device is turned over 180 degrees in a world reference frame as compared to how it was illustrated in the figures, then an item described herein as being "above" or "over" a second item in relation to the Figures would be "below" or "beneath" the second item in relation to the world reference frame. Moreover, the poses of items illustrated in the figure are chosen for convenience of illustration and description, but in an implementation in practice the items may be posed differently.

In addition, the singular forms "a," "an," and "the" are intended to include the plural forms as well, unless the context indicates otherwise. Moreover, the terms "comprises," "comprising," "includes," and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

Provide: As used herein, to "provide" an item means to have possession of and/or control over the item. This may include, for example, forming (or assembling) some or all of the item from its constituent materials and/or, obtaining possession of and/or control over an already-formed item.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}."

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the implementations disclosed herein. It is intended that the specification and examples be considered as exemplary only, with the following claims being entitled to their fullest breadth, including equivalents, under the applicable law.

What is claimed is:

1. A mechanical assembly, comprising:
a first mounting tray, the first mounting tray configured to have at least one printed circuit board mounted to a top surface of the first mounting tray, the first mounting tray comprising a first set of spools extending from a bottom surface of the first mounting tray in a direction away from the top surface, each one of the first set of spools including a barrel and a flange; and
a base pan, the base pan including a set of keyholes, each keyhole of the set of keyholes including an entry hole and a slot extending from the entry hole;
wherein the base pan is configured to attach to the first mounting tray by engaging the first set of spools with a first group of keyholes out of the set of keyholes, respectively, by inserting the flange of each spool of the first set of spools through the entry hole of a corresponding keyhole of the first group of keyholes and moving the first mounting tray relative to the base pan such that the barrel of each spool of the first set of spools is received within the slot of the corresponding keyhole and the flange of each spool of the first set of spools is engaged with and secured by a rim of the slot of the corresponding keyhole,
wherein the base pan is configured to attach to a second mounting tray in place of the first mounting tray, the second mounting tray having a second set of spools differing in number and/or location of spools from the first set of spools such that the base pan is configured to attach to the second mounting tray by engaging the second set of spools with a second group of keyholes out of the set of keyholes, the second group of keyholes differing from the first group of keyholes, and
wherein keyholes of the set of keyholes excluded from the second group of keyholes do not interfere with attachment of the second mounting tray to the base pan.

2. The mechanical assembly of claim 1, wherein, for each keyhole of the first group of keyholes: the entry hole of the respective keyhole has a diameter that exceeds a diameter of the flange of the corresponding spool of the first set of spools, and the slot of the respective keyhole has a width that is less than the diameter of the flange of the corresponding spool and greater than a diameter of the barrel of the corresponding spool.

3. The mechanical assembly of claim 1, wherein the rim of the slot in each one of the set of keyholes is chamfered inward from an outer surface of the base pan to an inner surface of the base pan.

4. The mechanical assembly of claim 3, wherein the rim of the slot in each one of the set of keyholes is chamfered inward from the outer surface toward the inner surface for a distance, in a thickness dimension of the base pan, of two thirds of a thickness of the base pan.

5. The mechanical assembly of claim 4, wherein the rim of the slot in each one of the set of keyholes is chamfered at an angle of 45 degrees with respect to the outer surface of the base pan.

6. The mechanical assembly of claim 4, wherein the flange of each one of the first set of spools is tapered inward from a distal face of the flange towards the barrel such that the tapered flange is complementary to the chamfered rim of the slot.

7. The mechanical assembly of claim 1, wherein a distal face of the flange of each one of the first set of spools is flush with an outer surface of the base pan when the first mounting tray is attached to the base pan and the first mounting tray is positioned adjacent an inner surface of the base pan.

8. The mechanical assembly of claim 1, wherein keyholes of the set of keyholes excluded from the first group of keyholes do not interfere with attachment of the first mounting tray to the base pan.

9. The mechanical assembly of claim 1, wherein the first group of keyholes comprises each of the set of keyholes and the second group of keyholes comprise fewer than each of the set of keyholes.

10. The mechanical assembly of claim 1, wherein the base pan lacks any protrusions that can interfere with attachment of the second mounting tray.

11. The mechanical assembly of claim 1, wherein a dimension of at least one of the second set of spools is different from the corresponding dimension associated with a second one of the second set of spools.

12. An electronic assembly comprising:
a printed circuit assembly;
a first mounting tray attached to the printed circuit assembly, the first mounting tray including a first set of spools extending from a bottom surface of the first mounting tray in a direction away from the printed circuit assembly, each of the first set of spools including a barrel and a flange; and
a base pan, the base pan including a set of keyholes, each keyhole of the set of keyholes including an entry hole and a slot extending from the entry hole;
wherein the base pan is configured to attach to the first mounting tray by engaging the first set of spools with a first group of keyholes out of the set of keyholes, respectively, by inserting the flange of each spool of the first set of spools through the entry hole of a corresponding keyhole of the first group of keyholes and moving the first mounting tray relative to the base pan such that the barrel of each spool of the first set of spools is received within the slot of the corresponding keyhole and the flange of each spool of the first set of spools is engaged with and secured by a rim of the slot of the corresponding keyhole of the first group of keyholes, wherein the base pan is configured to attach to a second mounting tray in place of the first mounting tray, the second mounting tray having a second set of spools differing in number and/or location of spools from the first set of spools such that the base pan is configured to attach to the second mounting tray by engaging the second set of spools with a second group of keyholes out of the set of keyholes, the second group of keyholes differing from the first group of keyholes, and wherein keyholes of the set of keyholes excluded from the second group of keyholes do not interfere with attachment of the second mounting tray to the base pan.

13. The electronic assembly of claim 12, for each keyhole of the first group of keyholes: the entry hole of the respective keyhole has a diameter that exceeds a diameter of the flange of the corresponding spool of the first set of spools, and the slot of the respective keyhole has a width that is less than the diameter of the flange of the corresponding spool and greater than a diameter of the barrel of the corresponding spool.

14. The electronic assembly of claim 12, wherein the slot in each one of the set of keyholes is chamfered inward from an outer surface of the base pan to an inner surface of the base pan, and wherein the flange of each one of the first set of spools is tapered inward from a distal face of the flange towards the barrel such that the tapered flange is complementary to the chamfered rim of the slot.

15. The electronic assembly of claim 12, wherein a distal face of the flange of each one of the first set of spools is flush with an outer surface of the base pan when the first mounting tray is attached the base pan and the first mounting tray is positioned adjacent an inner surface of the base pan.

16. The electronic assembly of claim 12, wherein the base pan lacks any protrusions that can interfere with accommodating the second mounting tray.

17. The electronic assembly of claim 12, wherein the first mounting tray further comprises a rear panel assembly, the rear panel assembly comprising a set of openings aligned with electrical interface connectors of the printed circuit assembly, the set of electrical interface connectors configured to connect external devices to the electronic assembly.

18. The electronic assembly of claim 12, wherein the printed circuit assembly is at least one of a motherboard, a memory board, a power supply board, a network communication board, or a combination thereof.

19. The electronic assembly of claim 12, wherein the electronic assembly is at least one of a compute node, a server node, a switch node, a storage node, or a combination thereof.

20. A method comprising:

positioning a first set of spools, included on a first mounting tray, proximate to a corresponding first group of keyholes, included on a base pan, in a chassis;

engaging each one of the first set of spools with a corresponding one of the first group of keyholes, by inserting a flange of each spool through an entry hole of the corresponding keyhole; and attaching the mounting tray to the base pan by moving the first mounting tray relative to the base pan such that a barrel of each spool of the first set of spools is received within a slot of the corresponding keyhole and the flange of each spool of the first set of spools is engaged with and secured by a rim of the slot of the corresponding keyhole of the first group of keyholes, wherein the base pan is configured to attach to a second mounting tray in place of the first mounting tray, the second mounting tray having a second set of spools differing in number and/or location of spools from the first set of spools such that the base pan is configured to attach to the second mounting tray by engaging the second set of spools with a second group of keyholes out of the set of keyholes, the second group of keyholes differing from the first group of keyholes, and wherein keyholes of the set of keyholes excluded from the second group of keyholes do not interfere with attachment of the second mounting tray to the base pan.

21. The method of claim 20, wherein a distal face of the flange of each one of the first set of spools is flush with an outer surface of the base pan when the first mounting tray is attached to the base pan and the first mounting tray is positioned adjacent an inner surface of the base pan.

* * * * *